(12) United States Patent
Tash et al.

(10) Patent No.: US 6,732,325 B1
(45) Date of Patent: May 4, 2004

(54) ERROR-CORRECTION WITH LIMITED WORKING STORAGE

(75) Inventors: Jonathan K. Tash, Menlo Park, CA (US); Scott F. Furman, Menlo Park, CA (US)

(73) Assignee: Digeo, Inc., Kirkland, WA (US)

( * ) Notice: Subject to any disclaimer, the term of this patent is extended or adjusted under 35 U.S.C. 154(b) by 427 days.

(21) Appl. No.: 09/709,005

(22) Filed: Nov. 8, 2000

(51) Int. Cl.[7] .............................................. H03M 13/03

(52) U.S. Cl. ...................................... 714/785; 714/793

(58) Field of Search ................................ 714/784, 785, 714/793

(56) References Cited

U.S. PATENT DOCUMENTS

| | | | |
|---|---|---|---|
| 4,030,067 A | * 6/1977 | Howell et al. | 714/758 |
| 4,675,869 A | * 6/1987 | Driessen | 714/759 |
| 5,115,436 A | 5/1992 | McAuley | 371/37.1 |
| 5,659,790 A | 8/1997 | Kim et al. | 395/806 |
| 5,715,262 A | 2/1998 | Gupta | 371/37.1 |
| 5,751,744 A | * 5/1998 | Babb | 714/800 |
| 5,778,187 A | 7/1998 | Monteiro et al. | 395/200 |
| 5,793,747 A | 8/1998 | Kline | 370/230 |
| 5,812,545 A | 9/1998 | Liebowitz et al. | 370/337 |
| 5,864,557 A | 1/1999 | Lyons | 370/444 |
| 5,870,412 A | 2/1999 | Schuster et al. | 371/37.1 |
| 5,926,459 A | 7/1999 | Lyles et al. | 370/230 |
| 5,930,248 A | 7/1999 | Langlet et al. | 370/347 |
| 5,974,583 A | 10/1999 | Joo | 714/784 |
| 5,983,005 A | 11/1999 | Monteiro et al. | 395/200.61 |
| 6,000,053 A | 12/1999 | Levine et al. | 714/766 |
| 6,002,687 A | 12/1999 | Magee et al. | 370/394 |
| 6,031,875 A | 2/2000 | Im | 375/262 |
| 6,041,431 A | * 3/2000 | Goldstein | 714/784 |
| 6,047,395 A | 4/2000 | Zook | 714/756 |
| 6,263,471 B1 | * 7/2001 | Huang | 714/784 |

FOREIGN PATENT DOCUMENTS

EP 0687072 A2 * 12/1995 ........... G06F/11/10

OTHER PUBLICATIONS

Brad Cain et al., "Generic Multicast Transport Services: Router Support for Multicast Applications", CMPSCI Technical Report TR 99–74, Oct. 1999, 15 pages.

Dan Rubenstein et al., "A Centralized, Tree–Based Approach to Network Repair Service for Multicast Streaming Media", AT&T Technical Memorandum TM HA1720000–991129–03, Nov. 1999, 20 pages.

Dan Rubenstein et al., "Improving Reliable Multicast Using Active parity Encoding Services (APES)", Technical Report 98–79, University of Massachusetts at Amberst, Department of Computer Science, Jul. 1998, 22 pages.

Dan Rubenstein et al., "Real–Time Reliable Multicast Using Proactive Forward Error Correction", Computer Science Department, University of Massachusetts at Amherst, dated prior to Nov. 8, 2000, 15 pages.

Dan Rubenstein et al., Real–Time Reliable Multicast Using Proactive Forward Error Correction (FEC), University of Massachusetts at Amherst, dated prior to Nov. 8, 2000, 14 slides.

(List continued on next page.)

Primary Examiner—R. Stephan Dildine
(74) Attorney, Agent, or Firm—Blakely, Sokoloff, Taylor & Zafman, LLP

(57) ABSTRACT

A method and apparatus for encoding and decoding linear block codes while using limited working storage is disclosed. For decoding, the error syndromes are calculated incrementally as each encoded symbol is received. That is, as each symbol, $r_i$ of the code word is received, the received symbol, $r_i$ is multiplied by the entries in the "ith" column of a decoding matrix, resulting in intermediate syndrome components. The intermediate syndrome components are added to the appropriate entry in a syndrome vector. Once all symbols $r_i$ are received, the syndrome vector contains the error syndromes $s_i$ for the received code word.

45 Claims, 19 Drawing Sheets

OTHER PUBLICATIONS

Dan Rubenstein et al., "The Impact of Multicast Layering on Network Fairness", Technical Report 99–08, Department of Computer Science, Feb. 1999, 27 pages.

Dan Rubenstein et al., "Improving Reliable Multicast Using Active Parity Encoding Serivces (APES)", University of Massachusetts at Amherst, dated prior to Nov. 8, 2000, 14 slides.

Dan Rubenstein, "Increasing the Functionality and Availability of Reed–Solomon FEC Codes: a Performance Study", Technical Report 98–31, Department of Computer Science, Aug. 1998, 18 pages.

Johannes Blomer et al., "An XOR–Based Erasure–Resilient Coding Scheme", dated prior to Nov. 8, 2000, 19 pages.

John W. Byers et al., "A Digital Fountain Approach to Reliable Distribution of Bulk Data", TR–98–013, dated prior to Nov. 8, 2000, 23 pages.

Jorg Nonnenmacher et al., "Parity–Based Loss Recovery for Reliable Multicast Transmission", *Technical Report 97–17*, Department of Computer Science, University of Massachusetts, Mar. 1997, 21 pages.

Lixin Gao et al., "Supplying Instantaneous Video–On–Demand Services Using Controlled Multicast", dated prior to Nov. 8, 2000, 21 pages.

Luigi Rizzo et al., "A Reliable Multicast Data Distribution Protocol Based on Software FEC Techniques", dated prior to Nov. 8, 2000, 10 pages.

Luigi Rizzo, "Effective Erasure Codes for Reliable Computer Communication Protocols", dated prior to Nov. 8, 2000, 13 pages.

Luigi Rizzo, "On the feasibility of Software FEC", available at http://www.iet.unipi.it/~luigi/softfec.ps, dated prior to Nov. 8, 2000, 16 pages.

Maya Yajnik et al., "Measurement and Modelling of the Temporal Dependence in Packet Loss", UMASS COMPSCI Technical Report #98–78, dated prior to Nov. 8, 2000, 22 pages.

Michael G. Luby et al., "Analysis of Random Processes Via An–Or Tree Evaluation", TR–97–042 dated prior to Nov. 8, 2000, 16 pages.

Michael Luby et al., "Practical Loss–Resilent Codes", dated prior to Nov. 8, 2000, 20 pages.

Sneha Kumar Kasera et al., "A Comparison of Server–Based and Receiver–Based Local Recovery Approaches for Scalable Reliable Multicast", CMPSCI Technical Report TR 97–69, Dec. 1997.

Subhabrata Sen et al., "Frame–based Periodic Broadcast and Fundamental Resource Tradeoffs", Technical Report 99–78 Department of Computer Science, dated prior to Nov. 8, 2000, 23 pages.

Subhabrata Sen et al., "Optimal Patching Schemes for Efficient Multimedia Streaming", UMASS CMPSCI Technical Report 99–22, dated prior to Nov. 8, 2000, 16 pages.

* cited by examiner $$C = GA$$

$$\begin{bmatrix} c_1 \\ c_2 \\ c_3 \\ \vdots \\ c_n \end{bmatrix} = \begin{bmatrix} G_{1,1} & G_{2,1} & G_{3,1} & \cdots & G_{k,1} \\ G_{1,2} & G_{2,2} & \cdots & \cdots & G_{k,2} \\ \vdots & \vdots & \ddots & \cdots & \vdots \\ \vdots & \vdots & \vdots & \ddots & \vdots \\ G_{1,n} & G_{2,n} & G_{3,n} & \cdots & G_{k,n} \end{bmatrix} \begin{bmatrix} a_1 \\ a_2 \\ a_3 \\ \vdots \\ a_k \end{bmatrix}$$ ← 402

For systematic codes -

$$\begin{bmatrix} c_1 \\ c_2 \\ c_3 \\ \vdots \\ \vdots \\ \vdots \\ c_n \end{bmatrix} \Leftrightarrow \begin{bmatrix} a_1 \\ a_2 \\ a_3 \\ \vdots \\ a_k \\ rd_1 \\ \vdots \\ rd_{n-k} \end{bmatrix}$$

⎫ 404 Original Source Data
⎫ 406 Redundant Data and, $$G = \begin{bmatrix} I \\ Y \end{bmatrix} = \begin{bmatrix} 1 & 0 & 0 & \cdots & 0 \\ 0 & 1 & 0 & \cdots & 0 \\ 0 & 0 & 1 & \cdots & 0 \\ \vdots & \vdots & \vdots & \vdots & \vdots \\ 0 & 0 & 0 & \cdots & 1 \\ Y_{1,1} & Y_{2,1} & Y_{3,1} & \cdots & Y_{k,1} \\ Y_{1,2} & Y_{2,2} & Y_{3,2} & \cdots & Y_{k,2} \\ \vdots & \vdots & \vdots & \vdots & \vdots \\ Y_{1,n-k} & Y_{2,n-k} & Y_{3,n-k} & \cdots & Y_{k,n-k} \end{bmatrix}$$ ← 408

$$\begin{bmatrix} H_{1,1} & H_{2,1} & H_{3,1} & \cdots & H_{n,1} \\ H_{1,2} & H_{2,2} & \cdots & \cdots & H_{n,2} \\ \vdots & \vdots & \ddots & \cdots & \vdots \\ \vdots & \vdots & \vdots & \ddots & \vdots \\ H_{1,n-k} & H_{2,n-k} & H_{3,n-k} & \cdots & H_{n,n-k} \end{bmatrix} \begin{bmatrix} r_1 \\ r_2 \\ r_3 \\ \vdots \\ r_n \end{bmatrix} = \begin{bmatrix} s_1 \\ s_2 \\ s_3 \\ \vdots \\ s_{n-k} \end{bmatrix}$$

504

$$\begin{bmatrix} s_1 \\ s_2 \\ \vdots \\ s_{n-k} \end{bmatrix} = \sum_{i=1 \text{ to } n} r_i \begin{bmatrix} H_{i,1} \\ H_{i,2} \\ \vdots \\ H_{i,n-k} \end{bmatrix}$$

*FIG. 5*

TUNABLE ECC LEVEL ON BLOCK-BY-BLOCK BASIS
ECC Level-1 (Encoded)
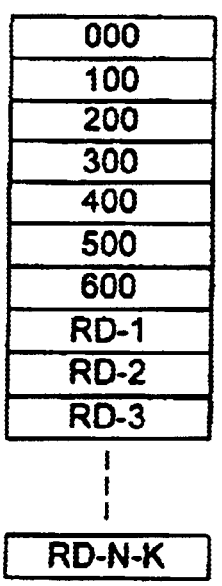
1300
ECC Level-2 (Encoded)
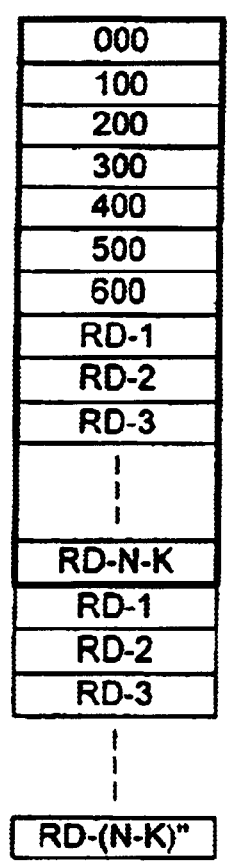
1304
ECC Quality Factor 0...10
1302 — ECC1 Block Size
ECC1 Data Block Size
ECC1 Block Interleave
1306 — ECC2 Block Size
ECC2 Data Block Size  } Only If Two Levels
ECC2 Block Interleave  } of ECC are Desired
*FIG. 13*

$$C = GA \qquad \text{\small 1400}$$

$$\begin{bmatrix} c_1 \\ c_2 \\ c_3 \\ \vdots \\ c_n \end{bmatrix} = \begin{bmatrix} G_{1,1} & G_{2,1} & G_{3,1} & \cdots & G_{k,1} \\ G_{1,2} & G_{2,2} & \cdots & \cdots & G_{k,2} \\ \vdots & \vdots & \ddots & \cdots & \vdots \\ \vdots & \vdots & \vdots & \ddots & \vdots \\ G_{1,n} & G_{2,n} & G_{3,n} & \cdots & G_{k,n} \end{bmatrix} \begin{bmatrix} a_1 \\ a_2 \\ a_3 \\ \vdots \\ a_k \end{bmatrix} \qquad \text{\small 1402}$$

$$\begin{bmatrix} c_1 \\ c_2 \\ \vdots \\ c_n \end{bmatrix} = \sum_{i=1 \text{ to } k} a_i \begin{bmatrix} G_{i,1} \\ G_{i,2} \\ \vdots \\ G_{i,n} \end{bmatrix} \qquad \text{\small 1404}$$

FIG. 14

ERROR-CORRECTION WITH LIMITED WORKING STORAGE

CROSS REFERENCE TO CO-PENDING APPLICATIONS

This application is related to U.S. patent application Ser. No. 09/293,594 filed Apr. 16, 1999, entitled "A Broadband Data Broadcast Broadcasting Service", and U.S. patent application Ser. No. 09/709,004 filed Nov. 8, 2000 entitled, "Method and Apparatus for Scheduling Broadcast Information, both of which are assigned to the assignee of the present invention and incorporated herein by reference.

BACKGROUND OF THE INVENTION

The present invention relates to methods and apparatus for detecting and correcting errors in transmitted or stored data, and more particularly, to methods and apparatus for detecting and correcting errors using limited working storage.

Error-correction codes (ECC) are commonly used in many of today's computer and telecommunication systems. For example, error detection and correction codes are used to minimize the number of errors and/or erasures (missing or known to be corrupted data) caused by unreliable communication channels, such as digital wireless transmission systems. In another example, error detection and correction codes are used to minimize the number of errors and/or erasures that are produced by high speed and high density magnetic or optical storage devices.

For many error correction codes (ECC), the data to be transmitted are processed mathematically to generate redundancy symbols, which are appended to the data to form code words, which are then transmitted. When the code words are received, the redundancy symbols are used to decode the received code words back into the original data.

Generally, more protection is provided by using more redundancy symbols. There is, however, an upper bound or "channel capacity" on the performance of any given channel. The "channel capacity" refers to the maximum data transmission rate (or recording density) that can be achievable for a given channel while maintaining an arbitrarily low error rate. Ultimately, the channel capacity is a function of the channel bandwidth and the signal to noise ratio (SNR) of the channel. Error correction codes can be thought of as helping to improve the channel performance by increasing the effective SNR.

There are many approaches for encoding/decoding the user data to maximize the reliability and efficiency of a channel. Ultimately, the goal is to design a system that approaches the channel capacity while minimizing the implementation complexity and cost. Block error-correcting codes are often used because of their good error correction properties and low implementation complexity and cost. The Reed-Solomon (RS) code is a particular type of block error-correction code.

Block codes typically encode a K-symbol input block of source data into an N-symbol output block or code word, where N-K is the number of redundancy symbols.

The code words are transmitted through the communication medium and decoded by a receiver. The encoding process includes a mathematical operation over the input block such that the output code words are different from one another by a parameter referred to as the minimum distance of the code $d_{min}$. The minimum distance $d_{min}$ determines the amount of noise that the system can tolerate before a received code word is decoded erroneously.

With Reed-Solomon (RS) codes, the data stream is processed as a sequence of symbols, where the symbols are typically selected from a finite field $GF(2^w)$, where the parameter "w" denotes the number of binary data bits per symbol. Each symbol of the K-symbol input block represents the coefficients of a data polynomial D(x). The redundancy symbols (which are also represented as a polynomial W(x)) are then computed as the modulo division of the input data polynomial D(x) divided by a generator polynomial G(x):

$$W(x)=(x^m \cdot D(x)) MOD\ G(x) \qquad \text{Equation (1)}$$

where m is the degree of the generator polynomial, which equals the number of redundancy symbols. The redundancy polynomial W(x) is then added to the data polynomial D(x) to generate a code word polynomial C(x):

$$C(x)=(x^m \cdot D(x))+W(x) \qquad \text{Equation (2)}$$

Those skilled in the art understand that the encoder circuitry for performing the above operations can be implemented with minimum cost using a linear feedback shift register (LFSR).

After encoding, the code word C(x) is transmitted through the noisy communication channel, wherein the received code word R(x) equals the transmitted code word C(x) plus an error polynomial E(x). The received code word R(x) is often corrected by: (1) computing the values of the error syndromes $s_i$; (2) computing the coefficients of an error locator polynomial using the error syndromes $s_i$; (3) computing the roots of the error locator polynomial, the logs of the roots being the error locations; and (4) computing the error values using the error syndromes $s_i$ and the roots of the error locator polynomial.

The error syndromes $s_i$ are computed as the modulo division of the received code word polynomial R(x) divided by the factors of the generator polynomial G(x):

$$S_i = R(x) MOD(x+\alpha^i) \qquad \text{Equation (3)}$$

when $$G(x) = \prod_{i=0}^{m-1} (x + \alpha^i) \qquad \text{Equation (4)}$$

where $\alpha$ is a primitive element of the finite field $GF(2^w)$. In practice, the error syndromes $s_i$ are often calculated using a relation similar to:

$$\begin{bmatrix} s_1 \\ s_2 \\ s_3 \\ \vdots \\ s_{n-k} \end{bmatrix} = \begin{bmatrix} r_1 \\ r_2 \\ r_3 \\ \vdots \\ r_n \end{bmatrix} \begin{bmatrix} H_{1,1} & H_{2,1} & H_{3,1} & \cdots & H_{n,1} \\ H_{1,2} & H_{2,2} & \cdots & \cdots & H_{n,2} \\ \vdots & \vdots & \ddots & \cdots & \vdots \\ \vdots & \vdots & \vdots & \ddots & \vdots \\ H_{1,n-k} & H_{2,n-k} & H_{3,n-k} & \cdots & H_{n,n-k} \end{bmatrix} \qquad \text{Equation (5)}$$

where vector "s" is the syndrome vector, vector "r" is the received code word, and matrix "H" is the decoding matrix calculated from the $MOD(x+\alpha_i)$ term of Equation (3).

Techniques for performing the remaining steps of the decoding process, including computing the error locator polynomial, computing the roots of the error locator polynomial, and computing the error values, are well known by those skilled in the art. See, for example, U.S. Pat. No. 5,446,743 to Zook, U.S. Pat. No. 5,715,262 to Gupta, U.S. Pat. No. 6,031,875 to Im, U.S. Pat. No. 6,041,431 to Goldstein, and U.S. Pat. No. 6,047,395 to Zook.

The use of erasure pointers is a technique that is commonly used to increase the power of an error correction code (ECC). An erasure pointer is typically an address pointing to a symbol location of a code word where an error is likely to have occurred. For example, an erasure pointer may be generated by a transport layer that detects timing phase errors, marginal amplitude signals, etc. Alternatively, or in addition, the erasure pointers may be generated by another layer of ECC coding. Regardless of how the erasure pointers are generated, the erasure pointers can be used to augment the error correction code by providing information in addition to the error syndromes $s_i$.

An erasure polynomial is commonly generated using the erasure pointers, where each root of the erasure polynomial replaces a root of the error locator polynomial. If the number of erasure pointers equals the number of error syndromes, then the erasure polynomial replaces the error locator polynomial.

Since the erasure pointer corresponds to the error location, only an error value needs to be computed for each erasure pointer, thereby accounting for the increase in the correction capability of the code. Without erasure pointers, the code is capable of correcting INT(m/2) code word symbols, where "m" is the degree of the generator polynomial (and the number of error syndromes). With erasure pointers, the code is capable of correcting n+INT((m−n)/2) code word symbols, where "n" is the number of erasure pointers. Thus, the error correction capability of the code in effect doubles when the number of erasure pointers equals the number of error syndromes, i.e., when "n" equals "m".

In most applications, the receiver includes working storage (e.g., Random If Access Memory) for providing short-term storage during the decoding process. For relatively high-speed applications, working storage is preferred over slower secondary storage (e.g., magnetic or optical disks) because the read and write times of most secondary storage devices are inadequate.

While working storage is fast, it is relatively expensive. Accordingly, reducing the amount of working storage would be beneficial. In most implementations, the amount of working storage that is required for decoding linear block codes is related to the size of the blocks. Therefore, one approach for reducing the required working storage is to reducing the block size. However, reducing the block size increases the redundancy overhead, which as described above, is undesirable in many cases.

Due to variations in the channel characteristics, e.g., such as multi-path and fading, received error rates may dramatically increase during short periods or bursts of time, which produce a burst of errors. If an error code is designed to provide adequate protection during these high error rate periods, the error code would impose excess redundancy during those times when the error rates are smaller.

A common technique that is used to accommodate such error bursts is to interleave symbols of different protected blocks during transmission, which spreads the errors of an error burst among several of the protected blocks. This reduces the probability that the error correction limit of any single block will be exceeded. Interleaving can be used to reduce the overall number of redundancy symbols required for a given post-correction error rate.

When the data from different blocks are interleaved, the amount of working storage that is required typically increases. The total working storage required for de-interleaving and decoding linear block codes is typically proportional to the degree of interleave required to accommodate the maximum time duration of an error burst given the transmitted bandwidth, and the block size. Accordingly, systems that accommodate long burst errors can require significant amounts of interleave and thus significant amounts of working storage.

What would be desirable, therefore, is a method and apparatus for performing error-correction while minimizing the amount of working storage. This may allow a maximum number of errors to be corrected with a minimum amount of working storage. Alternatively, larger block sizes or higher transmission rates may be used for a given amount of working storage, which may minimize excess redundancy and increase the "channel capacity" of the communication channel.

SUMMARY OF THE INVENTION

The present invention overcomes many of the disadvantages of the prior art by providing methods and apparatus for performing error-correction while minimizing the amount of working storage. When decoding linear block codes, the error syndromes $s_i$ are first calculated. To minimize the working storage required when calculating the error syndromes, the present invention calculates the error syndromes incrementally as each symbol of the code word is received. That is, as each symbol, $r_i$ of the code word is received, the received symbol, $r_i$ is multiplied by the entries in the "ith" column of a decoding matrix, resulting in intermediate syndrome components. The intermediate syndrome components are then added to the appropriate entry in a syndrome vector. Once all symbols $r_i$ are received, the syndrome vector contains the error syndromes $s_i$ for the received code word.

A benefit of using this approach is that all of the symbols of the incoming code word need not be stored in the working store simultaneously. Rather, each symbol is sequentially stored in the working store and then removed from the working store after the corresponding intermediate syndrome components are calculated. For later reference, all of the non-redundant symbols are stored in a secondary store, as the secondary store is much cheaper than the working store. While the present invention may not reduce the total amount of storage required for decoding a code word, it does allocate the storage requirements among both the working store and a secondary store. By minimizing the working store, significant cost savings may be achieved.

Once the syndrome vector is calculated, the location of the errored symbols can be identified using the syndrome vector, and an error magnitude for each errored symbol can be calculated, as described above.

To increase the power of the error correction code (ECC), it is contemplated that erasure locations may be identified prior to decoding the received code word. The erasure locations may be identified by, for example, detecting a timing phase error during tranmission, another ECC layer, etc. The erasure locations may then be used to augment the error correction code. Preferably, the erasure locations would be used in conjunction with the syndrome vector to identify the location of errored symbols in the received code word.

In one embodiment, the errored symbols are fetched from the secondary store once the errored symbols have been identified. The previously calculated error magnitudes are then applied to the errored symbols to produce corrected symbols. The syndrome vector, error locations, erasure locations, and error magnitudes may be stored only in the working store, or may be stored to the secondary store, depending on the available resources. The errored symbols and corrected symbols are preferably stored in the secondary store.

In a preferred embodiment, an incoming serial stream of symbols is provided that is protected by a linear block error-correction code. The serial stream of symbols preferably has N symbols, with K symbols being original data symbols (K<N), and N−K symbols being redundant symbols. A syndrome vector is first initialized to zero. Next, a decoding matrix is made available, wherein the decoding matrix has N columns and "N−K" rows. The decoding matrix may be calculated algorithmically on-the-fly, as symbols are received.

The serial stream of symbols, $r_i$, are then received, where "i" is an integer from 1 to N that identifies a particular one of the symbols within the serial stream of symbols. For each received symbol, $r_i$, it is determined if the received symbol corresponds to an erasure location. If so, the index "i" is recorded as an erasure location, and $r_i$ is set to zero.

Thereafter, the received symbol, $r_i$, is multiplied by the entries in the "ith" column of the decoding matrix, thereby resulting in "N−K" intermediate syndrome components. The "N−K" intermediate syndrome components are added to the corresponding entry in the syndrome vector. If the received symbol, $r_i$, is one of the original data symbols, the symbol, $r_i$, is stored to the secondary store. Once all N of the received symbols $r_i$ are received, the error locations are calculated using the syndrome vector and the identified erasure locations. Using the error locations and the syndrome vector, an error vector, e, is calculated. The error vector, e, identifies the error magnitudes for selected symbols in the received stream of symbols.

For each erasure location, j, the additive inverse of the error magnitude $e_j$ is calculated, or $-e_j$. The additive inverse $-e_j$ is then stored in the secondary store, preferably overwriting the symbol that corresponds to the erasure location, j. For each non-erasure error location, the error magnitude $e_j$ is subtracted from the corresponding errored symbol resulting in a corrected symbol. The corrected symbol is then stored in the secondary store, preferably overwriting the errored symbol that corresponds to the non-erasure error location.

The received symbols are preferably stored to the secondary store sequentially as they are received (i.e. in interleaved order). It is sometimes beneficial, therefore, for the symbols to be transmitted in the same order presented to the encoder/interleaver, as this may improve the readout performance of the corrected data from the secondary store (e.g., disk) when sequential access is more efficient than random access. To accomplish this, each symbol of an object may be assigned to one of a number of blocks. An object may be, for example, a digital stream of symbols that collectively represent a new story, a video clip, or any other unit or topic of information. Each of the blocks is encoded using a conventional block error-correction code. The symbols from two or more of the blocks are then interleaved to provide a stream of output symbols. The assigning, encoding and interleaving algorithms are preferably configured so that the stream of output symbols is delivered in the original order of the object. This may be accomplished by assigning the symbols to the blocks in the same order as the interleaver interleaves the symbols of the blocks.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 4 is a diagram showing an illustrating encoding algorithm commonly used for encoding linear block codes;

FIG. 5 is a diagram showing an illustrative method for calculating error syndromes of a linear block code using limited working storage in accordance with the present invention;

FIG. 13 is a diagram showing that each block may have a programmable (e.g., tunable) ECC level; and FIG. 14 is a diagram showing an illustrative encoding algorithm that uses limited working storage in accordance with the present invention.

DETAILED DESCRIPTION OF THE INVENTION

The detailed description that follows is presented largely in terms of algorithms and symbolic representations of operations on data bits within a computer or computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, or otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

The present invention is preferably implemented for practice by a computer programmed to control the operations therein. It is contemplated that a number of source code expressions, in one of many computer languages, can be used to implement the present invention. The present invention also relates to apparatus for performing these operations. This apparatus may be specially constructed for the required purposes, or may be a general purpose computer as selectively activated or reconfigured by a computer program stored in the computer. The algorithms presented herein are not inherently related to a particular computer system or other apparatus. In particular, various general-purpose computer systems may be used with computer programs written in accordance with the teachings of the present invention, or it may prove more convenient to construct more specialized apparatus to perform the recited method steps.

Figure 1:
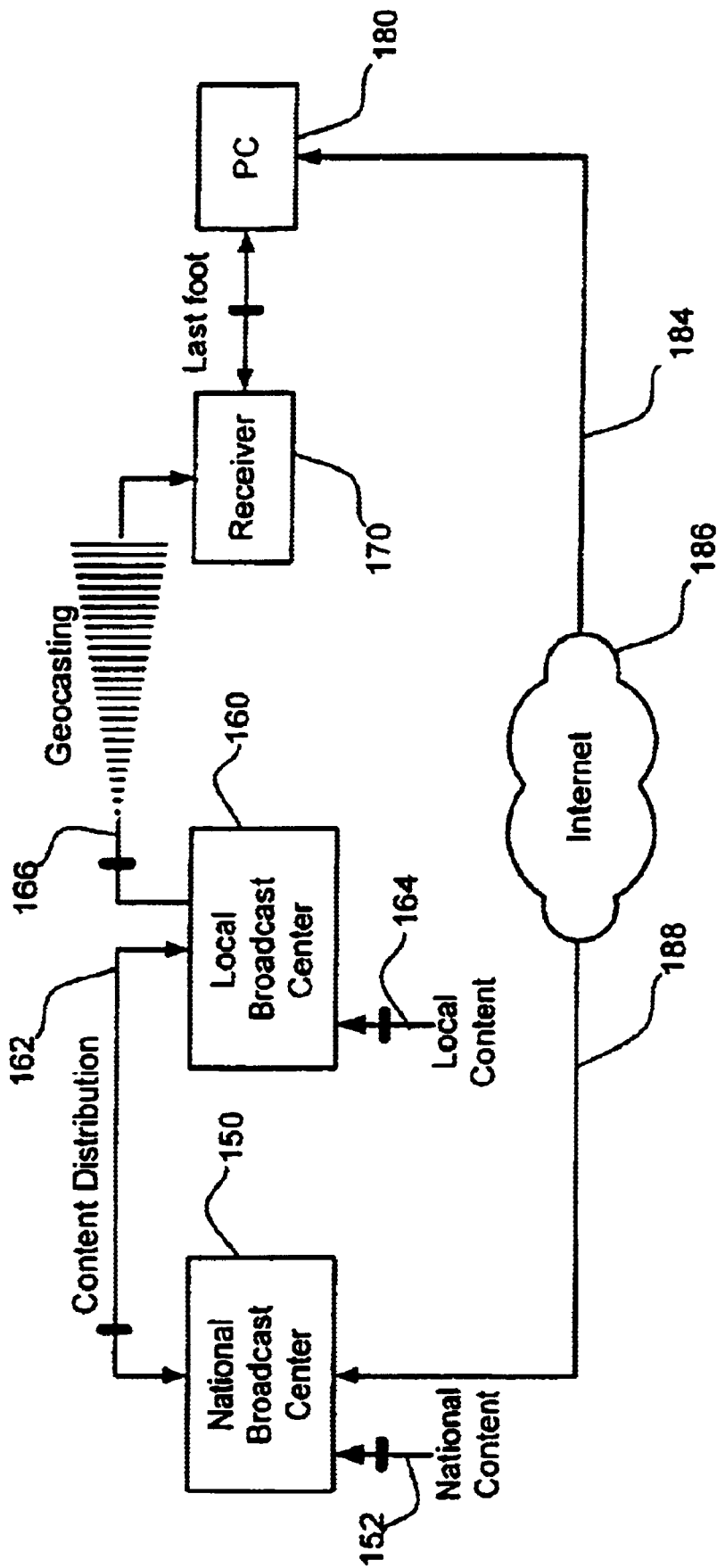
FIG. 1 is a block diagram of an illustrative broadband data broadcasting system that includes the present invention.

Referring to FIG. 1, a national broadcast control center 150 is shown for receiving digital information from a number of different data origination sources via one or more national content channels 152. The data origination sources may be any entity that provides digital information for broadcast data over a data broadcast medium. For example one type of entity that may provide digital information for broadcast data over a data broadcast medium may be a broadcast news studio that creates audio and/or video news segments. The audio and/or video news segments must be digitized before or after transmission to the national broadcast center 150.

The national broadcast center 150 processes the incoming digital information stream from the various data origination sources by adding addressing information, stream descriptor information, and error correction coding (ECC). Other stream processing operations may be performed such as encryption of the information streams. The national broadcast center 150 then multiplexes the received digital information streams from the various data origination sources to provide a single national broadcast stream.

After processing the individual digital information streams and multiplexing the individual digital information streams into a single national broadcast stream, the national broadcast center 150 modulates the multiplexed digital information stream onto a national digital broadcast signal. The national broadcast center 150 transmits the national digital broadcast signal on a broadcast distribution medium 162. In one embodiment, a satellite broadcast system is used to broadcast the digital broadcast signal to a large number of receiving sites, such as local broadcast center 160. It is contemplated, however, that any type of broadcast media can be used such as digital broadcast television signals, cable television signals, radio frequency broadcasts, terrestrial wireless signals, or any other suitable broadcast medium.

The local broadcast center 160 receives the national digital broadcast signal via national broadcast distribution medium 162. The local broadcast center 160 demodulates the national digital broadcast signal to retrieve the multiplexed digital information stream. The local broadcast center 160 may also receive locally generated broadcast content via one or more local data origination sources 164. The local data origination sources 164 may include, for example, additional data broadcast formatted content with local advertisers and local news teams created by local digital television broadcast stations. Once received, the local broadcast center 160 may add addressing information, stream descriptor information, and error correction coding (ECC). Other stream processing operations may also be performed, such as encryption of the information streams.

The local broadcast center 160 then multiplexes the locally generated data broadcast content with the national digital information stream, to provide a local broadcast digital information stream. The local broadcast center 160 then modulates the multiplexed local broadcast digital information stream into a local digital broadcast signal 166. The local broadcast center 160 transmits the local broadcast digital signal 166 on a local broadcast distribution medium, such as a terrestrial wireless broadcast system, a digital broadcast television signal, a cable television signal, a radio frequency broadcast, a direct video broadcast satellite signal, or any other suitable broadcast medium.

A receiver system 170 receives the local broadcast signal 166 from the local broadcast center 160. The receiver system 170 may then present the information to a user, preferably through an appliance such as a personal computer that is connected to the receiver system 170.

To provide selectivity, the receiver system 170 may examine the address portions of the data packets and/or stream descriptor portions of each digital information stream to determine if the user of the receiver system 170 is interested in the particular digital information stream. For example, the user of the receiver system 170 may be interested in a particular digital information stream if that digital information stream matches a set of preprogrammed interest parameters defined by the user and programmed into the receiver system 170. The receiver system 170 may cache the matching digital information streams and/or directly output the matching digital information streams to the user's system 180.

A back channel 184 may be provided from the user's system 180 (or from the receiver system 170) to the internet 186. The back channel 184 may connect to, for example, the national broadcast center 150 as shown at 188, the local broadcast center 160, or any other site on the internet. Although not required, the back channel 184 may provide a feedback mechanism from the user's system 180 to the broadcasting centers, a control center, vendor sites, etc. Additional information on the above-illustrative broadband data broadcasting service is available in co-pending U.S. patent application Ser. No. 09/293,594, entitled "A Broadband Data Broadcasting Service", which is incorporated herein by reference.

Figure 2:
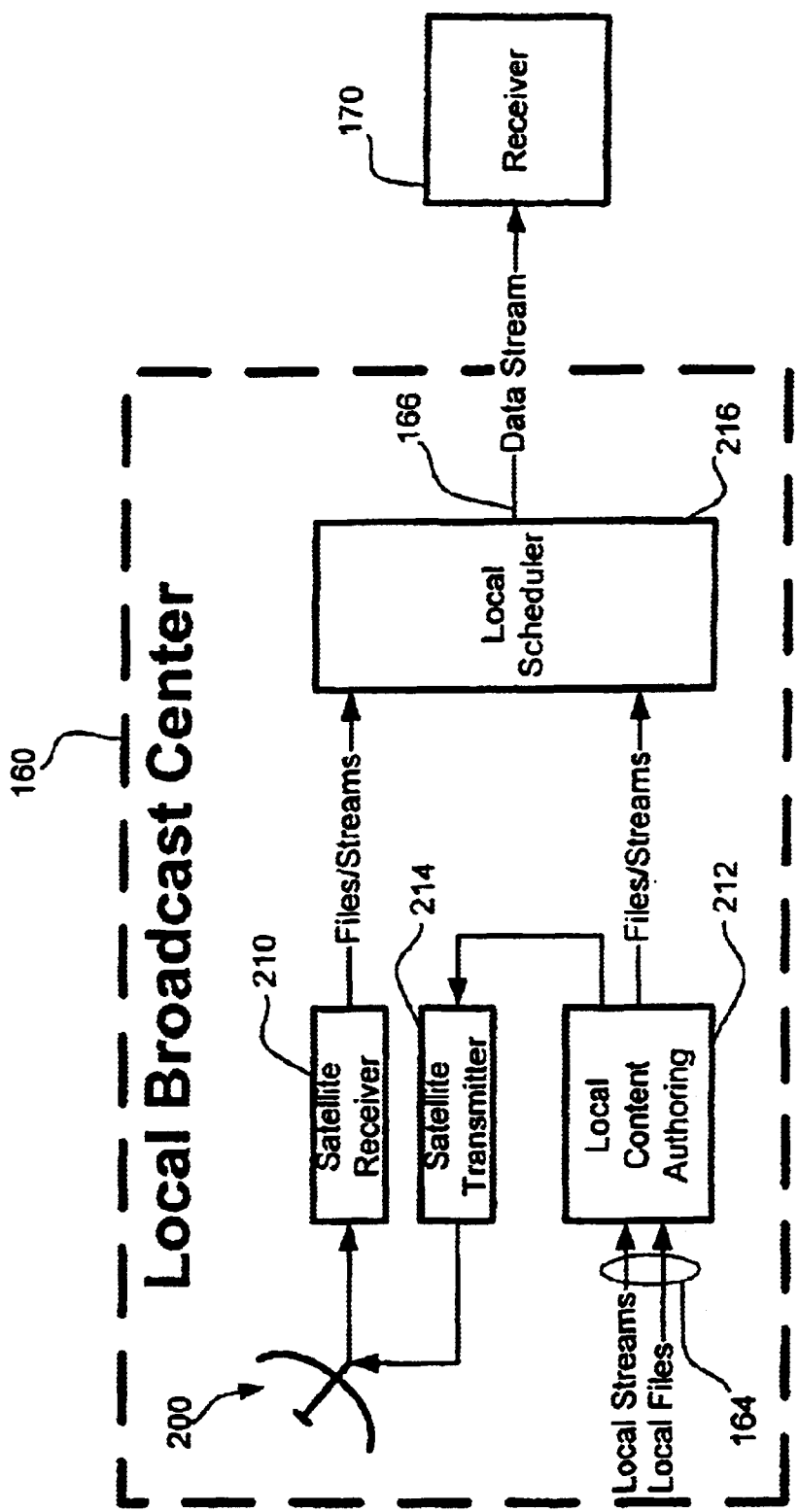
FIG. 2 is a block diagram of the local broadcasting center of FIG. 1.

FIG. 2 is a block diagram of an illustrative local broadcasting center 160. As indicated above, the local broadcast center 160 receives the national digital broadcast signal via national broadcast distribution medium 162. In the embodiment shown, the local broadcasting center 160 receives the national digital broadcast signal via a satellite broadcast digital television antenna 200. The national digital broadcast signal is provided to a receiver front-end system 210 that includes receiver circuitry for demodulating the national digital broadcast signal to retrieve the multiplexed digital information stream.

The local broadcast center 160 may also receive locally generated broadcast content via one or more local data origination sources 164. Once received, a local content authoring block 212 may add addressing information, stream descriptor information, and error correction coding (ECC). Other stream processing operations may also be performed, such as encryption of the information streams. The local content authoring block 212 may then provide some or all of the locally generated data broadcast content to a transmitter system 214 for transmission to other local broadcast centers or to the national broadcast center 150 for distribution to other markets.

The local content authoring block 212 also preferably provides the locally generated data broadcast content to a scheduler block 216. Scheduler block 216 preferably multiplexes the locally generated data broadcast content with the national digital information stream, to provide a local broadcast digital information stream. Because the volume of content provided by the national broadcast center 150 and the local content channels 164 may be more than can be broadcast on the local digital broadcast signal 166, the local scheduler 216 preferably provides some level of selectivity for selecting and scheduling digital content so that a wide variety of up-to-date content is provided. The remaining content may be provided to a garbage queue. A further discussion of local scheduler 216 can be found in U.S. patent application Ser. No. 09/709,004, entitled "Broadcast Scheduling Manager", which is incorporated herein by reference.

The local broadcast center 160, and in the embodiment shown, the local scheduler 216, modulates the multiplexed local broadcast digital information stream into a local digital broadcast signal 166. The local digital broadcast signal 166 is then transmitted via a broadcast distribution medium to a receiver system 170, as described above.

When transmitting data over an unreliable channel it is desirable to minimize the number of errors and erasures (missing or known to be corrupted data) induced by the channel or by an imperfect transmitter or receiver. It is for this reason that error-correcting codes (ECC) are frequently employed, particularly in digital wireless transmission systems. In the illustrative embodiment of FIGS. 1 and 2, the unreliable channels may include, for example, the national broadcast distribution channel 162 and the local broadcast distribution channel 166.

Error correction codes (ECC), and in particular block error correction codes, add redundant symbols to the stream of original information symbols to aid in the reconstruction of information symbols that are either not received (erasures) or become corrupted in transit. For block codes, an encoder typically generates a fixed-size block of symbols from a smaller group of information symbols.

Figure 3:
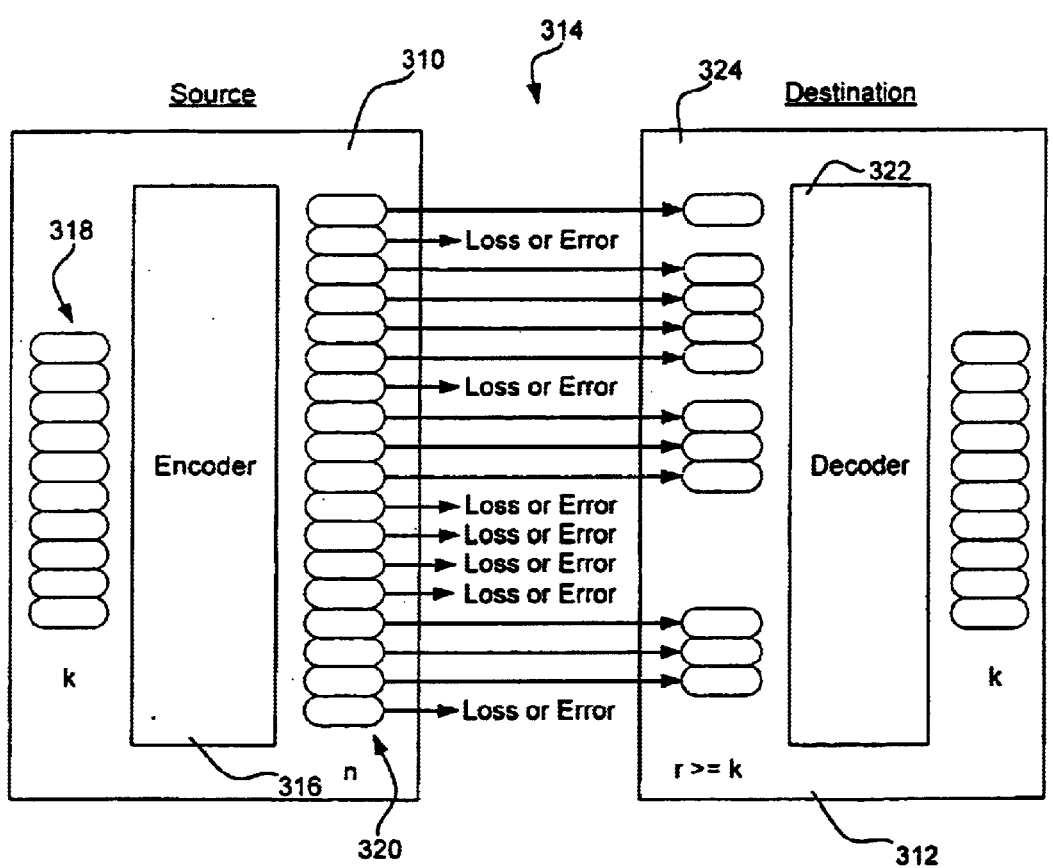
FIG. 3 is a block diagram of a channel using a typical block ECC code.

FIG. 3 is a block diagram of a channel using a typical block erasure ECC code. A source 310 transmits a stream of data to a destination 312 across an unreliable channel 314. For block codes, the source 310 first gathers "K" symbols 318 from the incoming data stream to form a block. Each symbol may have one or more data bits. An encoder 316 then encodes the "K" source symbols to produce "N" encoded symbols 320. The additional "N-K" symbols are often referred to as redundant symbols. When properly encoded, any subset of "K" symbols can be used to reconstruct the "K" original source symbols 318, assuming all "K" symbols in the subset are error free. Such a block erasure code is commonly referred to as a (N,K) code. A further discussion of encoding (N,K) codes is provided below with reference to FIG. 4.

The "N" encoded symbols are transmitted from the source 310 to the destination 312, across unreliable channel 314. Some of the symbols may be lost (e.g., erasure) or corrupted during transmission. The symbols that are not lost are received at destination 312. Some of the received symbols 324 may be corrupted and thus set to zero, while others may not. So long as the number of error-free symbols "R" is greater than or equal to "K", the decoder 322 can recover the original "K" symbols 318.

FIG. 4 is a diagram showing an illustrating encoding algorithm commonly used for encoding linear block codes. As indicated above, in an (N,K) error-correcting block code, the incoming data stream is split into groups of K information symbols. (If less than K symbols are available at the encoder input, zeroes are substituted for the missing symbols). From this group of K symbols, the encoder generates a single code word "C" which contains N symbols.

Let "A" be the input vector of K information symbols. Let "C" be the code word vector of N transmitted symbols. The N transmitted signals may be calculated by multiplying a generator matrix "G" over a finite field, where G is a matrix with "N" rows and "K" columns. For "linear" block codes, any K rows of G are linearly independent. Thus, and as shown at 400, C=GA. A more detailed expression of the equation C=GA is shown at 402.

For systematic codes, the first "N" entries of the code word "C" are the original data symbols, as shown at 404. The remaining "N-K" entries of the code word "C" correspond to the redundant symbols, as shown at 406. Systematic codes are typically generated by using a generator matrix G that has the identity matrix in the first "K" rows and "K" columns, and a generator matrix Y in the bottom "N-K" rows and "K" columns. One such generator matrix G is shown at 408. While the present invention is not limited to systematic error codes, there are often advantages to their use including ease of decoding.

As indicated above, the code word "C" is transmitted to a receiver, which then decodes the received code word. Let "R" be the received code word. If one or more errors occurred during the transmission of code word "C", then the received code word "R" equals the original code word "C" plus an error vector "E". That is, R=C+E. The indices of elements of error vector "E" that have non-zero values are the error locations. An error location of the error vector "E" that is known by external means, i.e., is not computed from R, is an erasure location. The value of $r_i$, where "i" is an erasure location, is zero. If the number of error and erasure locations is within the correction capabilities of the code, then the block is fully correctable. That is, the value of "A" can be recovered from "R".

Erasure locations can be determined in a variety of ways. One such way is to add a checksum to each symbol and mark the symbol as an erasure if the checksum fails. Another way is to detect a timing phase error or a marginal amplitude signal level in the transport signal, and provide a transport error if either of these fails. Other mechanisms may also be used including, for example, marking the transmitted symbols with an incrementing ID, and using the ID to identify when an intervening symbol is not received.

As indicated above, when decoding a linear block code, a first step often includes calculating the error syndromes $s_i$. FIG. 5 is a diagram showing an illustrative method for calculating the error syndromes using limited working storage in accordance with one embodiment of the present invention. The error syndromes s are typically calculated using a relation similar to S=HR, where "R" is the received code word and H is a decoding matrix. This relation is shown at 500, and is expressed in more detail at 502. There are two observations about this relation. First, value of the syndrome vector "S" is a linear combination of the columns of H. Accordingly, the syndrome calculation can be rewritten as the sum of "N" intermediate syndrome components, as shown at 504. Second, the value of the error vector "E" can be computed from the syndrome vectors "S", without referencing the received code word "R". Thus, the error vector "E" can be computed without retaining "R" in working storage.

Accordingly, and to minimize working storage, the error syndromes may be calculated incrementally as each symbol of the code word is received. For example, as each symbol, $r_i$ of the code word is received, the received symbol, $r_i$ is multiplied by the entries in the "ith" column of a decoding matrix H, resulting in intermediate syndrome components. The intermediate syndrome components are then added to the appropriate entry in the syndrome vector "S". Once all symbols $r_i$ are received, the syndrome vector "S" will contain the N–K error syndromes $s_i$ for the received code word "R".

A benefit of using this approach is that the all of the symbols of the received code word "R" need not be stored in the working store simultaneously. Rather, each symbol, $r_i$ may be sequentially stored in a working store and then removed from the working store after the corresponding intermediate syndrome components are calculated. For later reference, all of the received non-redundant symbols $r_i$ are preferably stored in a secondary store, as the secondary store is much cheaper than the working store.

While the present invention may not reduce the total amount of storage required for decoding a received code word "R", it does allocate the storage requirements among both working storage and secondary storage. As indicated above, the working store (e.g., DRAM) is typically faster, but more expensive than the secondary store (e.g., disk). By minimizing the working store, significant cost savings may be achieved.

Figure 6:
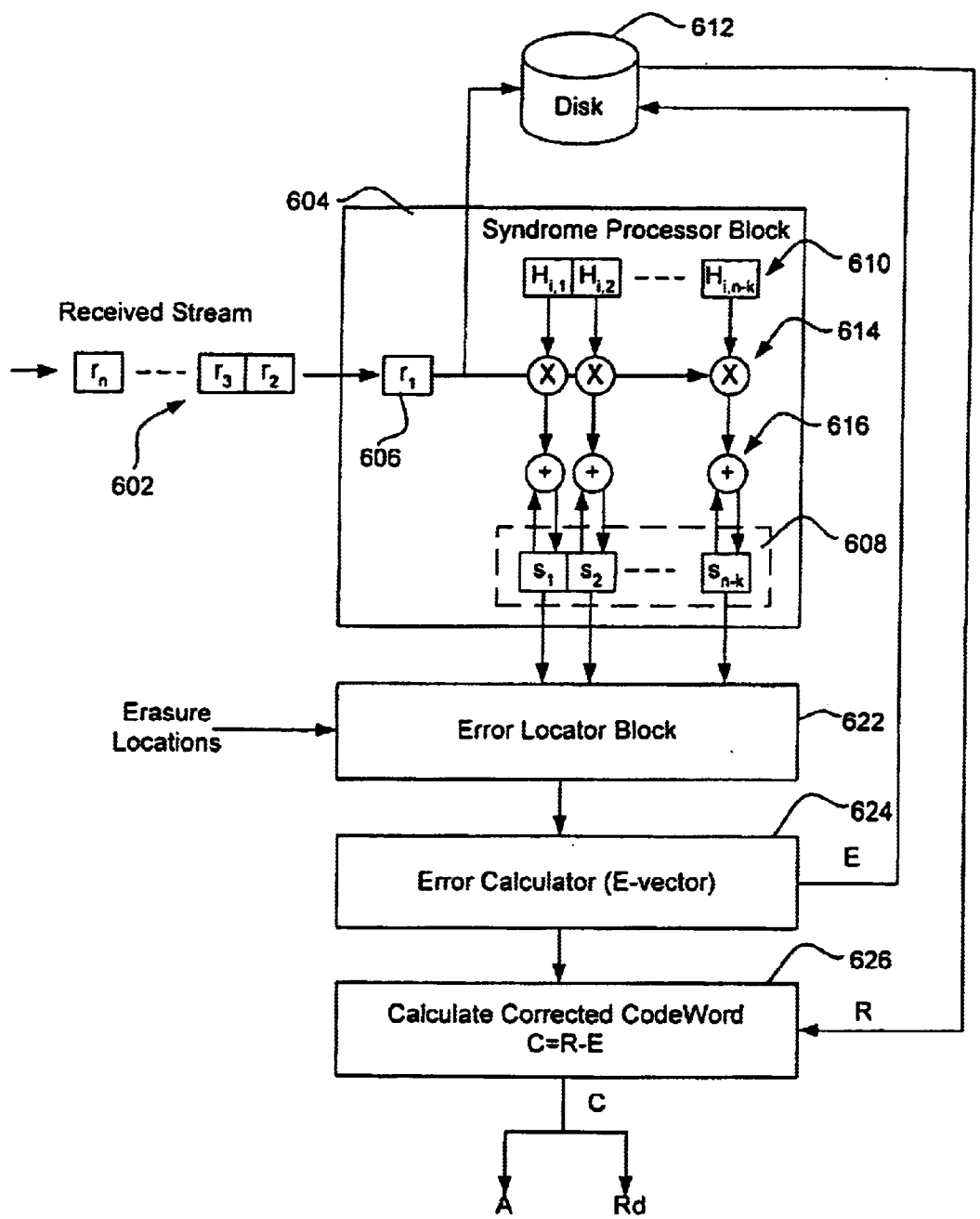
FIG. 6 is a schematic diagram of an illustrative decoder for decoding a linear block code using limited working storage.

FIG. 6 is a schematic diagram of an illustrative decoder for decoding a linear block code using limited working storage. A stream of symbols 602 is provided to a syndrome processor 604. The syndrome processor 604 includes a working store for storing at least the most recent received symbol, $r_i$ 606, and the syndrome vector 608. The decoding matrix H 610 may be stored in the working store, or may be stored in a non-volatile memory, the secondary store 612 or any other storage element, or may be computed algorithmically, i.e. on-the-fly as the symbols are received.

Initially, all error syndromes $s_i$ are set to zero. The illustrative syndrome processor 604 includes "N–K" multiplier blocks shown generally at 614 for multiplying the most recently received symbol, $r_i$, by the entries in the "ith" column of the decoding matrix H 610, resulting in "N–K" intermediate syndrome components. The "N–K" intermediate syndrome components are then added to the appropriate entry in the syndrome vector 608 using "N–K" adders 616. In the illustrative embodiment, the current value of the syndrome vector 608 is supplied to the adders 616 via corresponding return interfaces, as shown. Once all symbols $r_i$ are received, the syndrome vector 608 contains the error syndromes $s_i$ for the received code word "R".

Once the syndrome vector 608 is calculated, the error location block 622 identifies the symbols that have errors using the syndrome vector 608. This may be accomplished using conventional linear block decoding techniques. To increase the power of the error correction code, erasure locations may be provided to the error location block 622. The erasure locations may be identified by, for example, a timing phase error, a marginal amplitude in a transmission signal, another ECC layer, etc. The erasure locations may be used to augment the error correction capability by providing information in addition to the syndrome vector 608. Preferably, the erasure locations are used in conjunction with the syndrome vector 608 to identify the location of errored symbols in the received code word.

The location of the errored symbols and the syndrome vector 608 are provided to error calculator block 624. Error calculator block 624 uses the location of the errored symbols and the syndrome vector 608 to calculate an error magnitude for each errored symbol. This is preferably performed using conventional linear block decoding techniques. The error magnitudes are then provided to a calculate corrected code word block 626.

Once the errored symbols are identified, the errored symbols may be fetched from the secondary store 612. Preferably, non-errored symbols are not fetched. The previously calculated error magnitudes are then applied to the errored symbols to produce corrected symbols. The syndrome vector, error locations, erasure locations, and error magnitudes may be stored only in the working store, or may be stored to the secondary store 612, depending on the available resources. The corrected symbols are preferably stored back to the secondary store 612. To increase the performance of the system, it is contemplated that the corrected symbols may be written to the same location as the previously stored errored symbols in the secondary store 612.

Alternatively, it is contemplated that the error calculator block 624 may store the error locations and error magnitudes to the secondary store 612. Then, at some later time, such as when the symbols are accessed, the error calculator 624 may read up the error locations and error magnitudes and apply them to the errored symbols, as described above. This may save considerable time when, for example, some of the data symbols are never consumed, or when it is convenient for the corrected symbols to be calculated "off line". This technique increases the number of sequential accesses to the secondary storage, which improves secondary storage performance particularly if data is not consumed.

Figure 7:
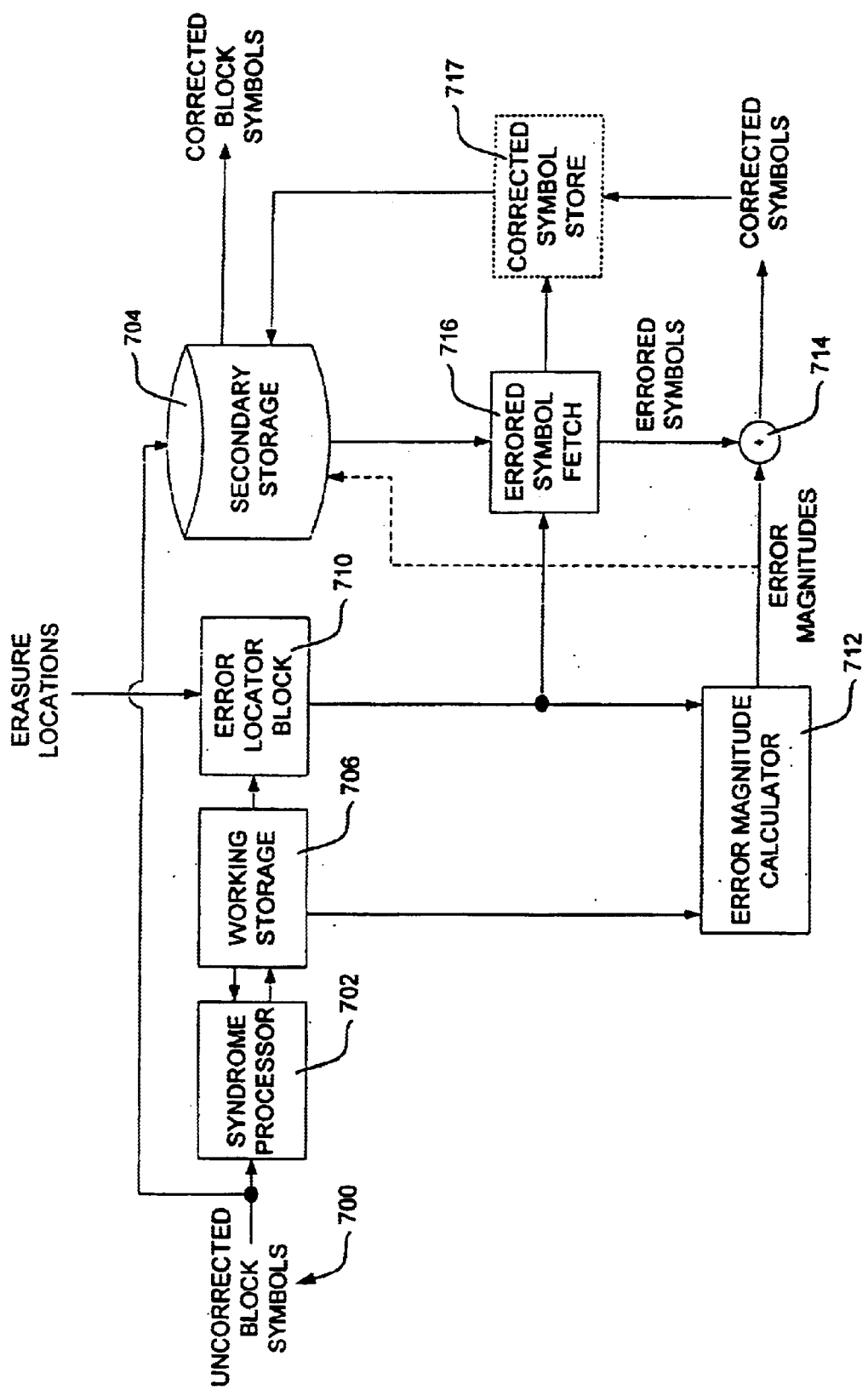
FIG. 7 is a schematic diagram of another decoder for decoding linear block codes using limited working storage.

FIG. 7 is a schematic diagram of another illustrative decoder in accordance with the present invention. This embodiment is similar to the embodiment shown in FIG. 6. A stream of uncorrected symbols 700 is provided to both a syndrome processor 702 and a secondary store 704. The secondary store 704 stores the uncorrected symbols for later reference.

The syndrome processor 702 is coupled to working store 706. The syndrome calculator block 702 stores at least the most recently received uncorrected symbol and a syndrome vector. A decoding matrix H may also be stored in the working store, or may be stored in a non-volatile memory, the secondary store 704 or some other storage element, or may be algorithmically computed.

The syndrome processor 702 multiplies the most recently received uncorrected symbol, $r_i$ by the entries in the "ith" column of the decoding matrix H, resulting in "N–K" intermediate syndrome components. The "N–K" intermediate syndrome components, which are stored in the working store, are then added to the appropriate entry in the syndrome vector. Once all of the symbols $r_i$ are received, the syndrome vector contains the error syndromes $s_i$ for the received uncorrected code word "R".

Once the syndrome vector is calculated, the syndrome vector is provided to the error locator block 710. The error locator block 710 identifies those symbols that have errors, preferably by using the syndrome vector read from the working store 706. To increase the power of the error correction code, erasure locations may be provided to the error locator block 710. Preferably, the erasure locations are used in conjunction with the syndrome vector to identify the location of errored symbols in the received code word.

The location of the errored symbols and the syndrome vector are then provided to error magnitude calculator block 712. Error magnitude calculator block 712 uses the location of the errored symbols and the syndrome vector to calculate an error magnitude for each errored symbol, preferably using conventional linear block decoding techniques.

The error magnitudes are then provided to an adder block 714 and/or to the secondary store 704. If the error magnitudes are provided directly to the adder block 714, the symbol fetch block 716 fetches the errored symbols from the secondary store and provides them to the adder block 714. The adder block 714 then adds the error magnitudes to the corresponding errored symbols to produce corrected symbols. The corrected symbols are then provided to a corrected symbols store block 717 that writes them to the secondary store 704, replacing the errored symbols.

Alternatively, it is contemplated that the error locations and error magnitudes may be first stored to the secondary store 612. Then, at some later time, such as when the symbols are accessed, the symbol fetch block 716 may fetch the errored symbols and the corresponding error magnitudes, and provide them to the adder block 714.

The adder block 714 may then add the error magnitudes to the corresponding error symbols to produce corrected symbols. The corrected symbols may then be provided to a corrected symbols store block 717, and/or to the secondary store 704. This may save considerable time when, for example, some of the data symbols are never consumed, or when it is convenient for the corrected symbols to be calculated "off line".

Figure 8:
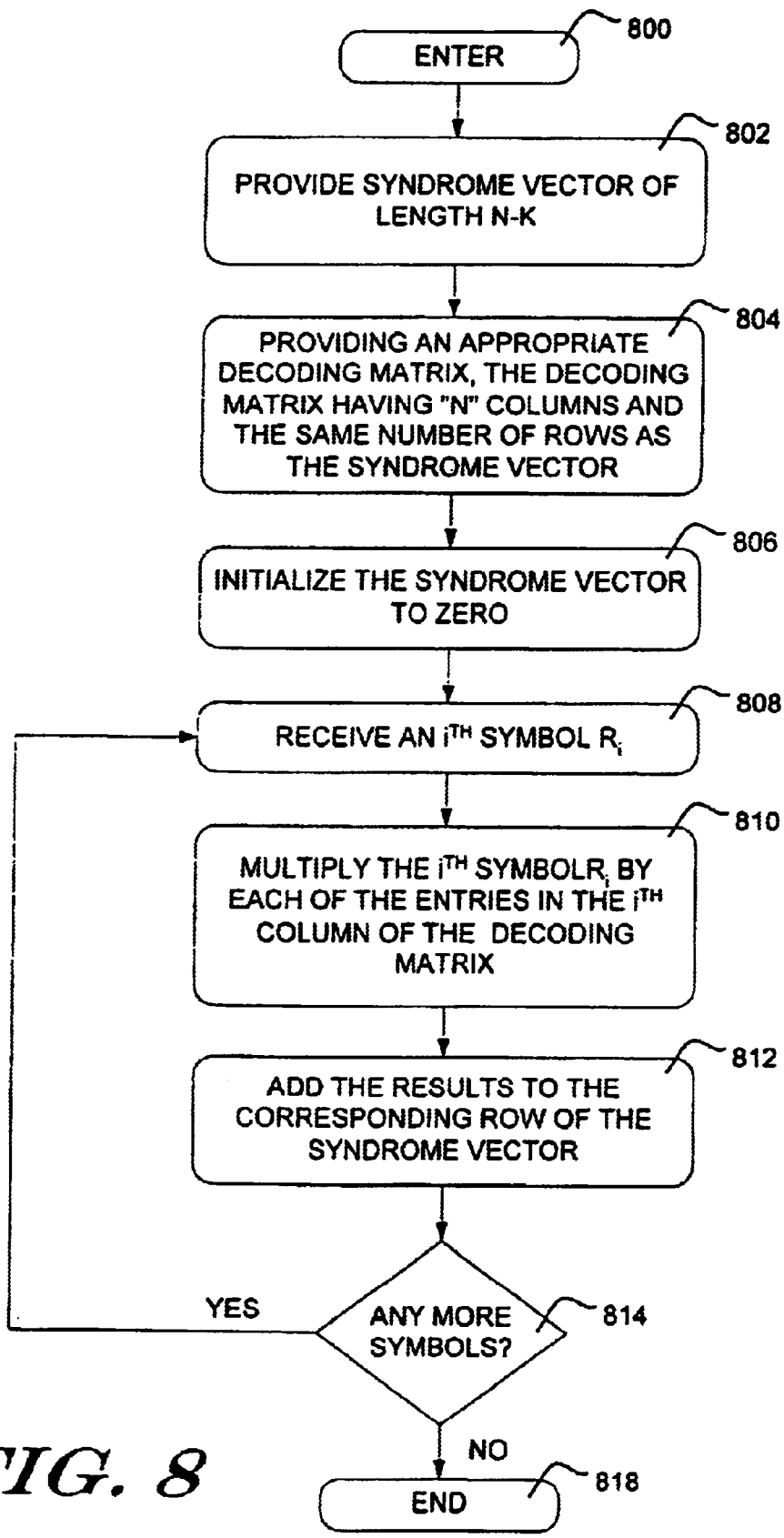
FIG. 8 is a flow diagram of an illustrative method for calculating the error syndromes of a linear block code in accordance with the present invention.

FIG. 8 is a flow diagram of an illustrative method for calculating the error syndromes of a linear block code in accordance with the present invention. The method is entered at step 800. Step 802 provides an un-initialized syndrome vector of length N–K, and step 804 provides an appropriate decoding matrix. The decoding matrix preferably has "N" columns, and the same number of rows as the syndrome vector. Step 806 initializes the syndrome vector to zero.

An $i^{th}$ uncorrected symbol, $r_i$ is received at step 808. Step 810 multiplies the $i^{th}$ uncorrected symbol, $r_i$ by each of the entries in the "$i^{th}$" column of the decoding matrix, and step 812 adds the resulting vector to the syndrome vector. Step 814 determines if there are any more symbols in the block. If there are more symbols in the block, control is passed back to step 808, which gets the next uncorrected symbol, $r_i$. If there are no more symbols in the block, control is passed to step 818, wherein the algorithm is exited.

Figure 9A:
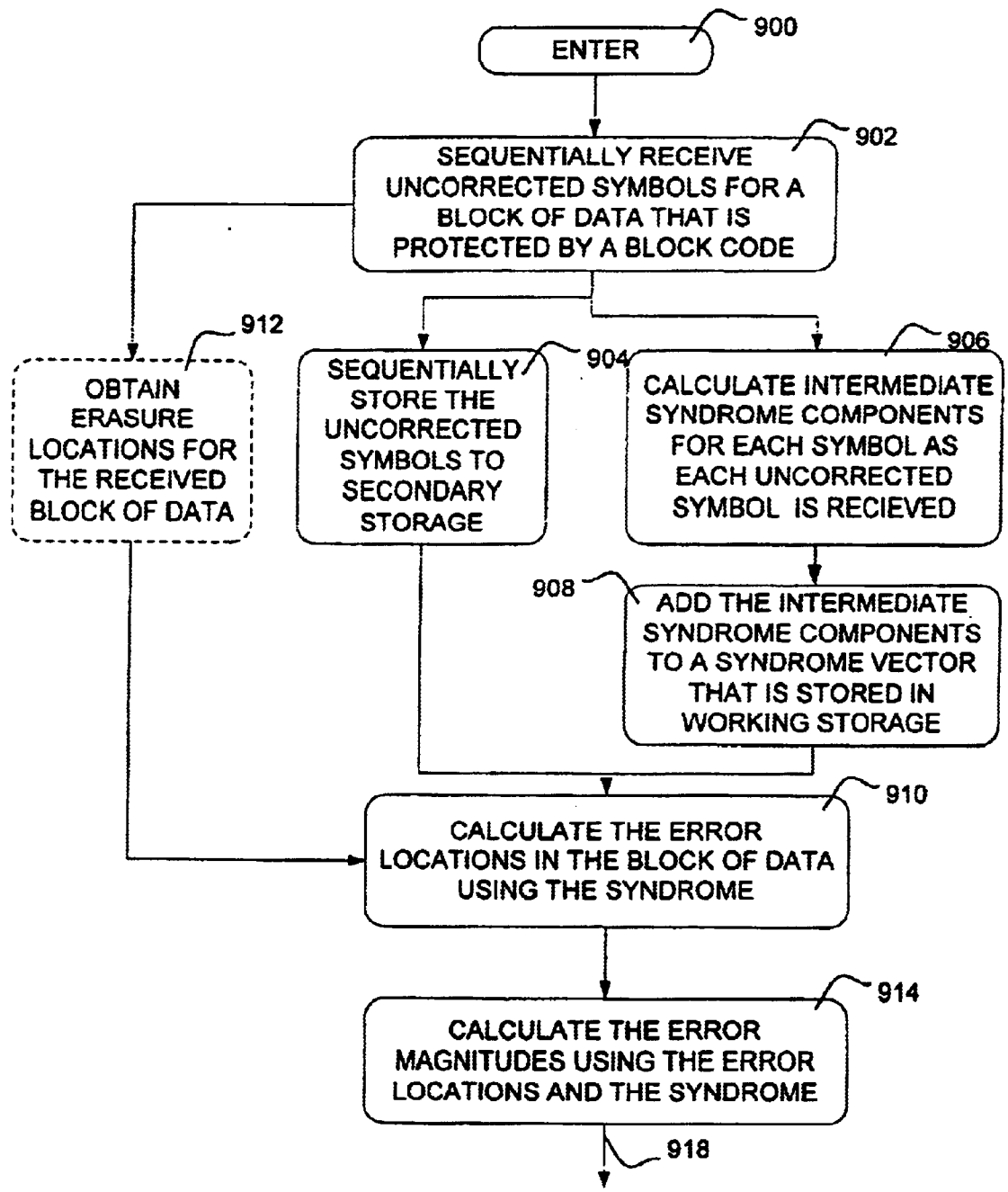
FIG. 9A is a flow diagram of an illustrative method for calculating the error syndromes, error locations and error magnitudes for a linear block code in accordance with the present invention.

FIG. 9A is a flow diagram of an illustrative method for calculating the error syndromes, error locations and error magnitudes for a linear block code in accordance with the present invention. The method is entered at step 900. Step 902 sequentially receives uncorrected symbols for a block of data that is protected by a block error-correction code. Control is then passed to both steps 904 and 906. Step 904 sequentially stores the uncorrected symbols to a secondary store. Step 906 calculates intermediate syndrome components for each symbol, as each symbol is received. Step 908 adds the intermediate syndrome components for each received symbol to a syndrome vector, which is stored in working storage.

Once all of the uncorrected symbols are received, step 910 calculates the error locations in the block of data using the error syndrome. In some embodiments, step 912 may be used to obtain erasure locations for the received block of data, and to provide the erasure locations to step 910. Erasure locations may be used to augment the error correction capability by providing information in addition to the syndrome. Preferably, the erasure locations are used in conjunction with the syndrome to help identify the location of errored symbols in the received code word.

Once the error locations are identified, the error locations and the syndrome are provided to step 914. Step 914 uses the error locations and the syndrome to calculate an error magnitude for each errored symbol, preferably using conventional linear block decoding techniques.

Figure 9B:
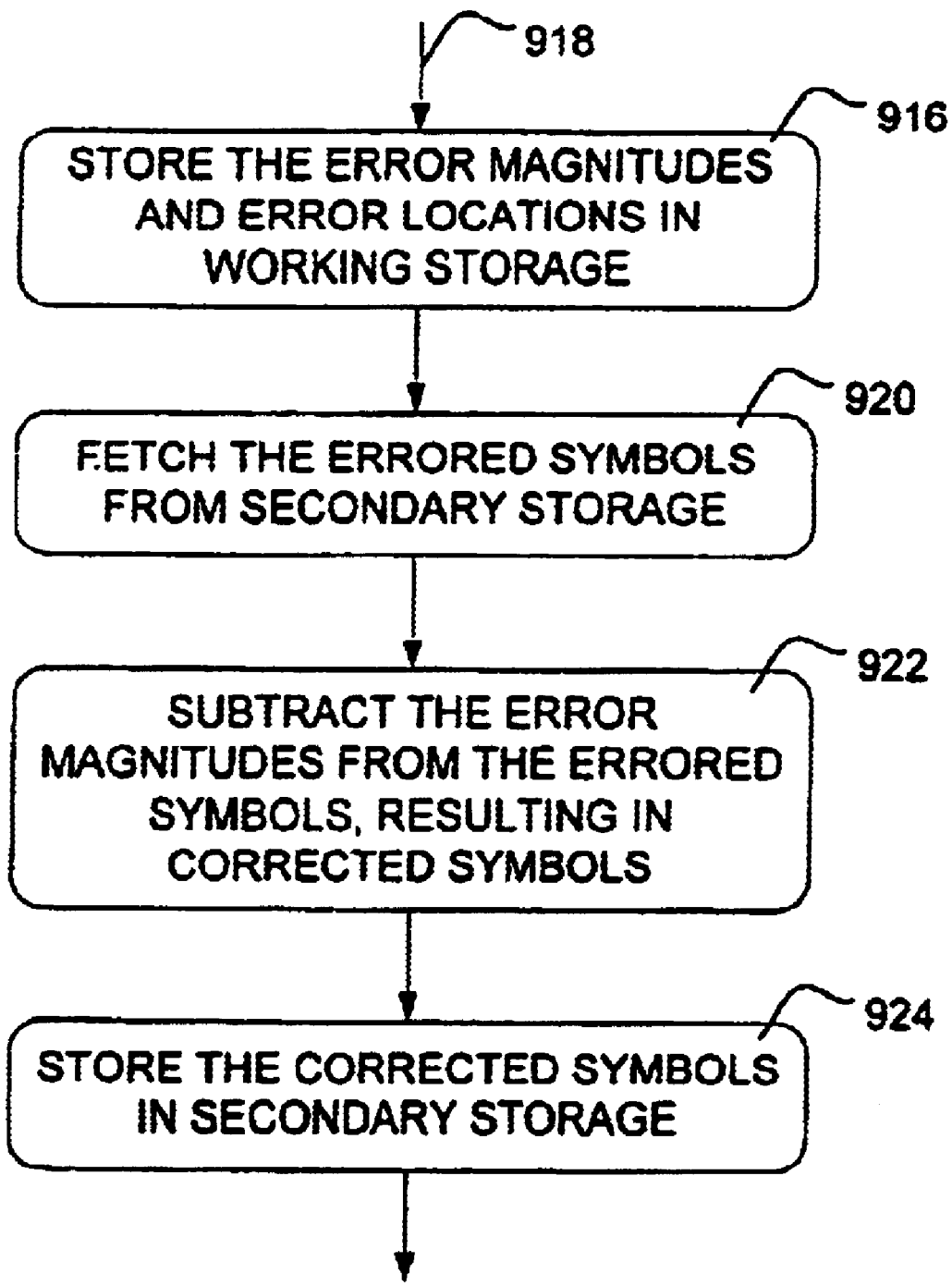
FIG. 9B is a continuation of FIG. 9A showing an illustrative method for determining corrected symbols using the error locations and error magnitudes calculated in FIG. 9A.

FIG. 9B is a continuation of FIG. 9A showing an illustrative method for determining corrected symbols using the error locations and error magnitudes calculated in FIG. 9A. Step 916 stores the error magnitudes and the error locations in working storage. Step 920 fetches the errored symbols from secondary storage, and step 922 subtracts the error magnitudes from the corresponding errored symbols, resulting in corrected symbols. Step 924 stores the corrected symbols in secondary storage.

Figure 9C:
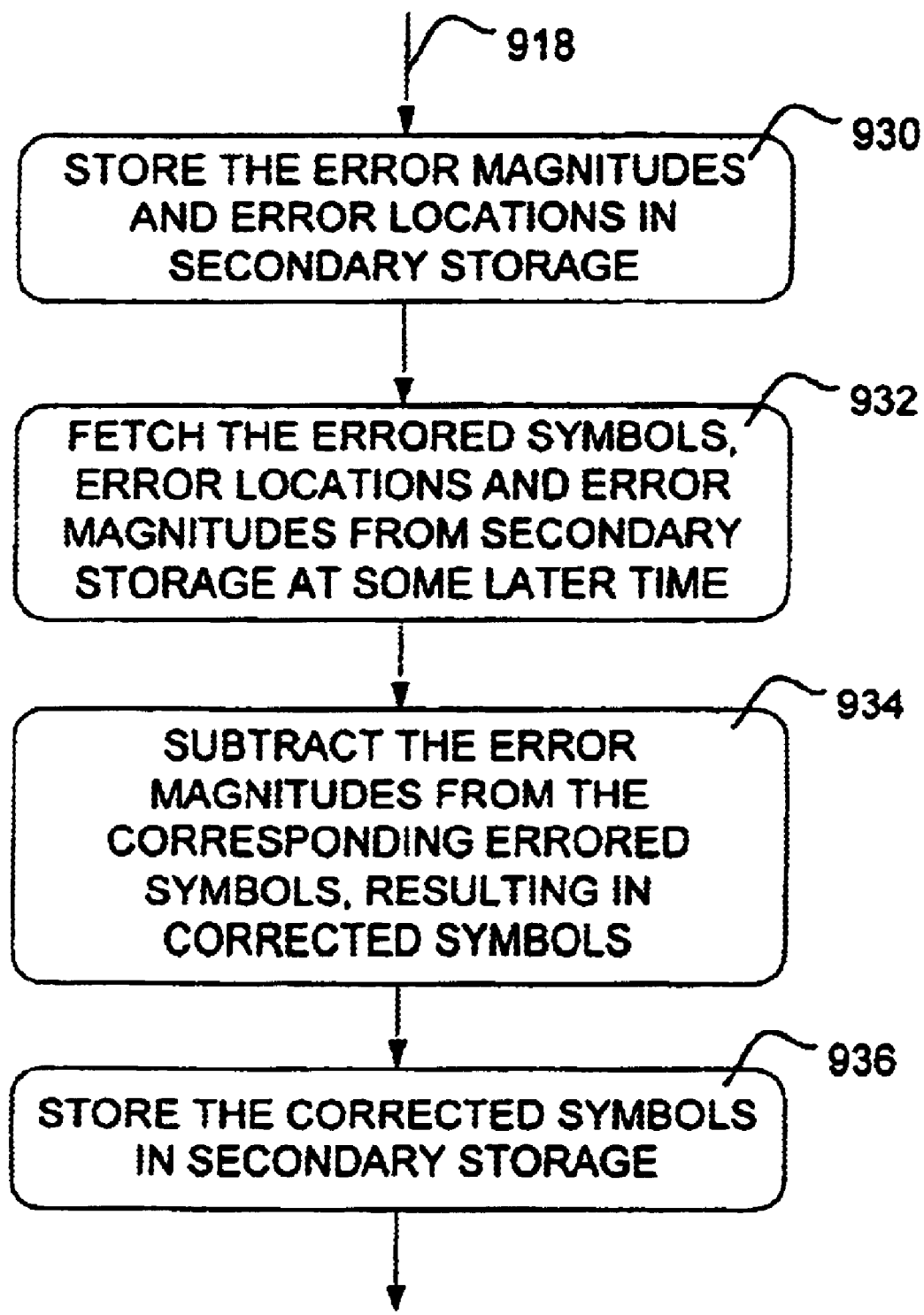
FIG. 9C is a continuation of FIG. 9A showing another illustrative method for determining corrected symbols using the error locations and error magnitudes calculated in FIG. 9A.
Figure 10A:
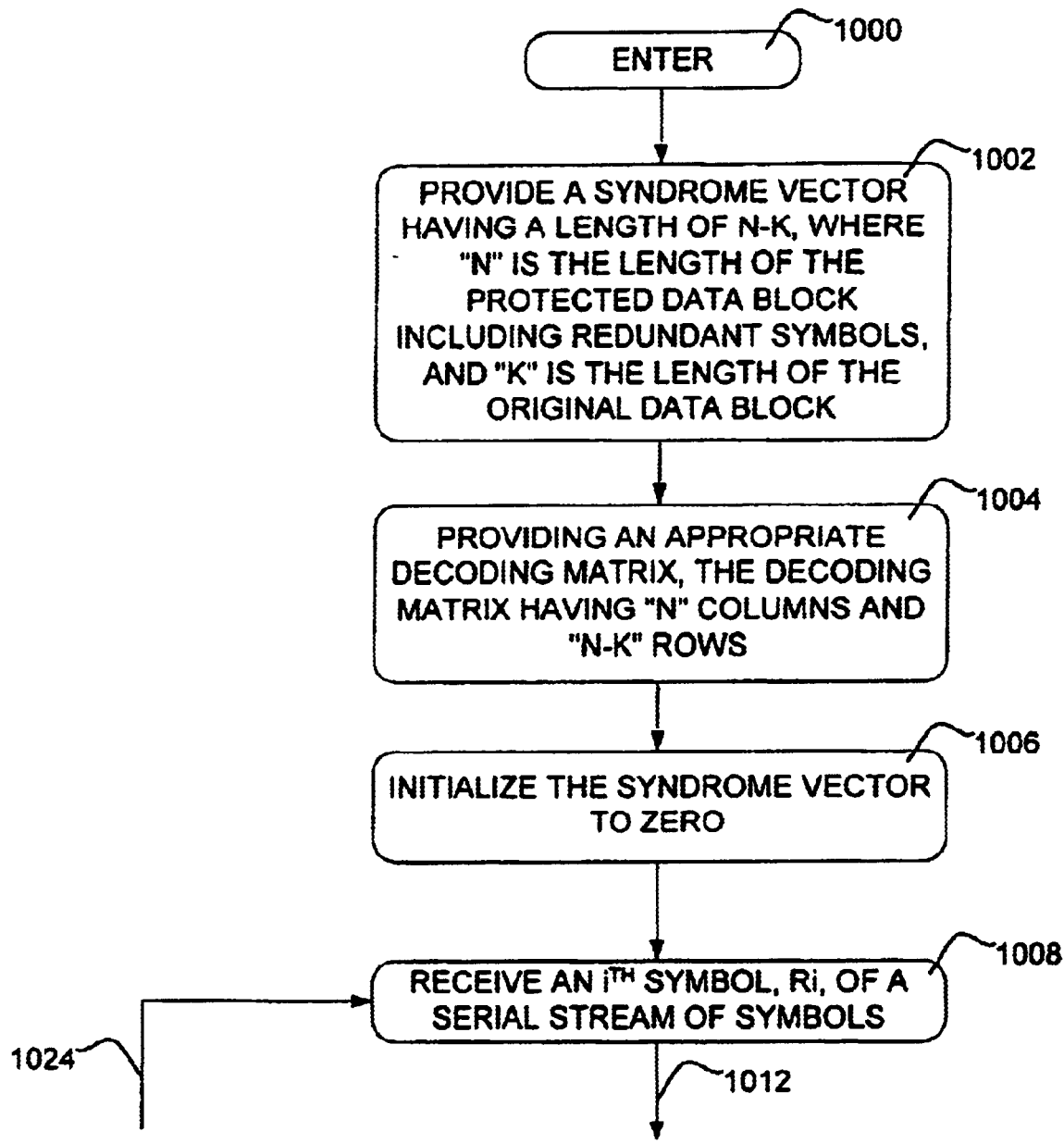
FIGS. 10A–10D show a flow diagram of yet another illustrative method for decoding a linear block code using limited working storage.
Figure 10B:
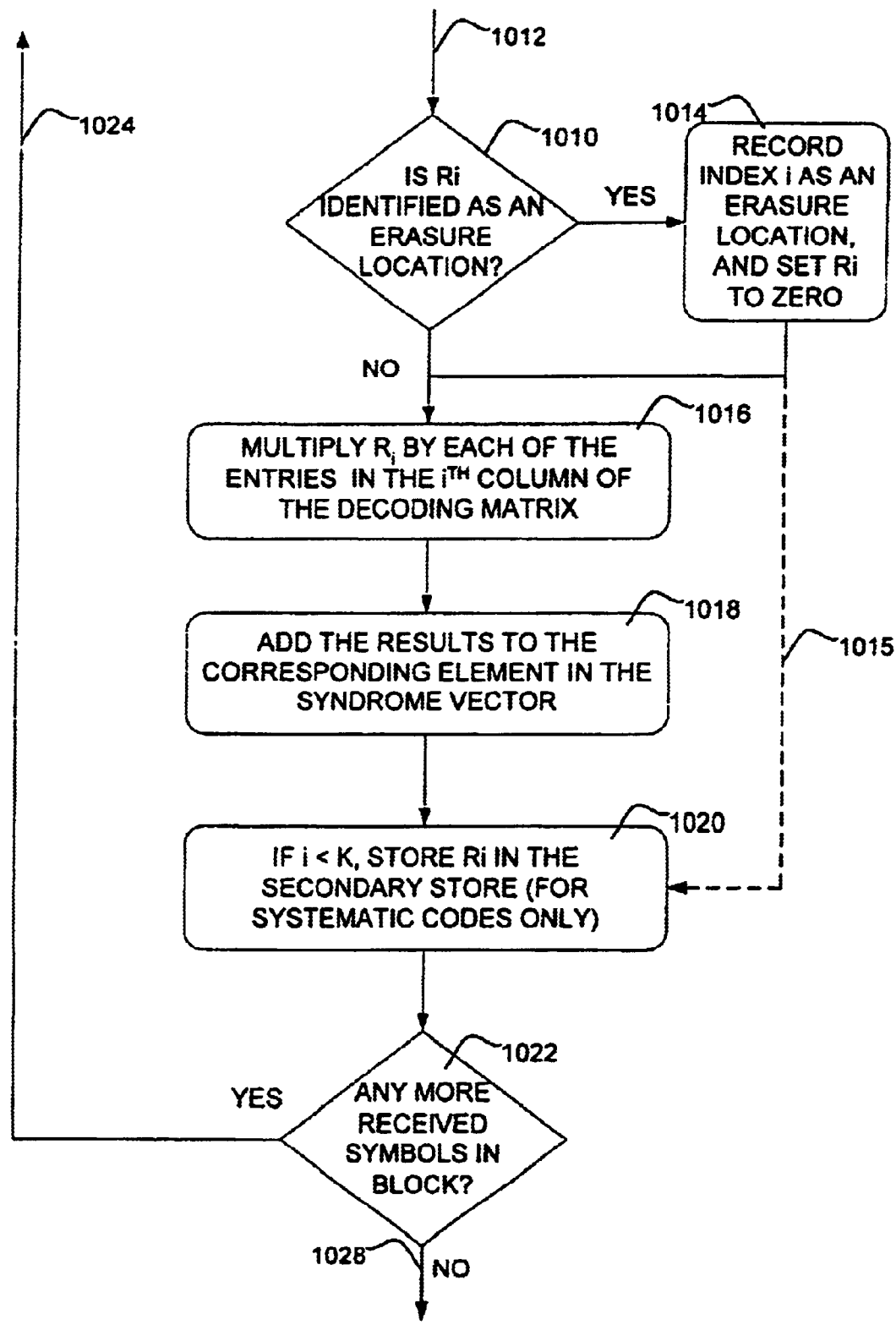
Figure 10C:
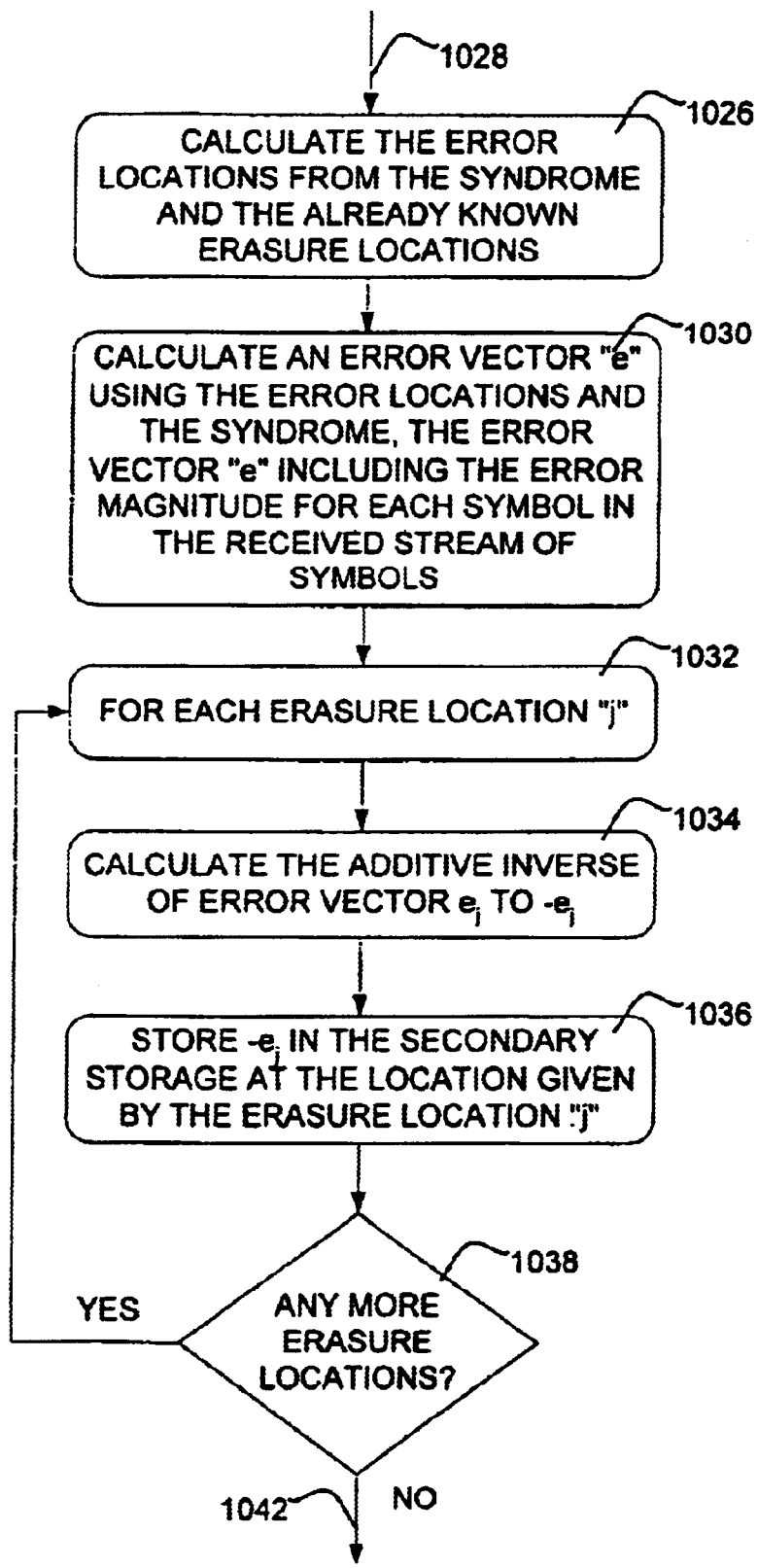
Figure 10D:
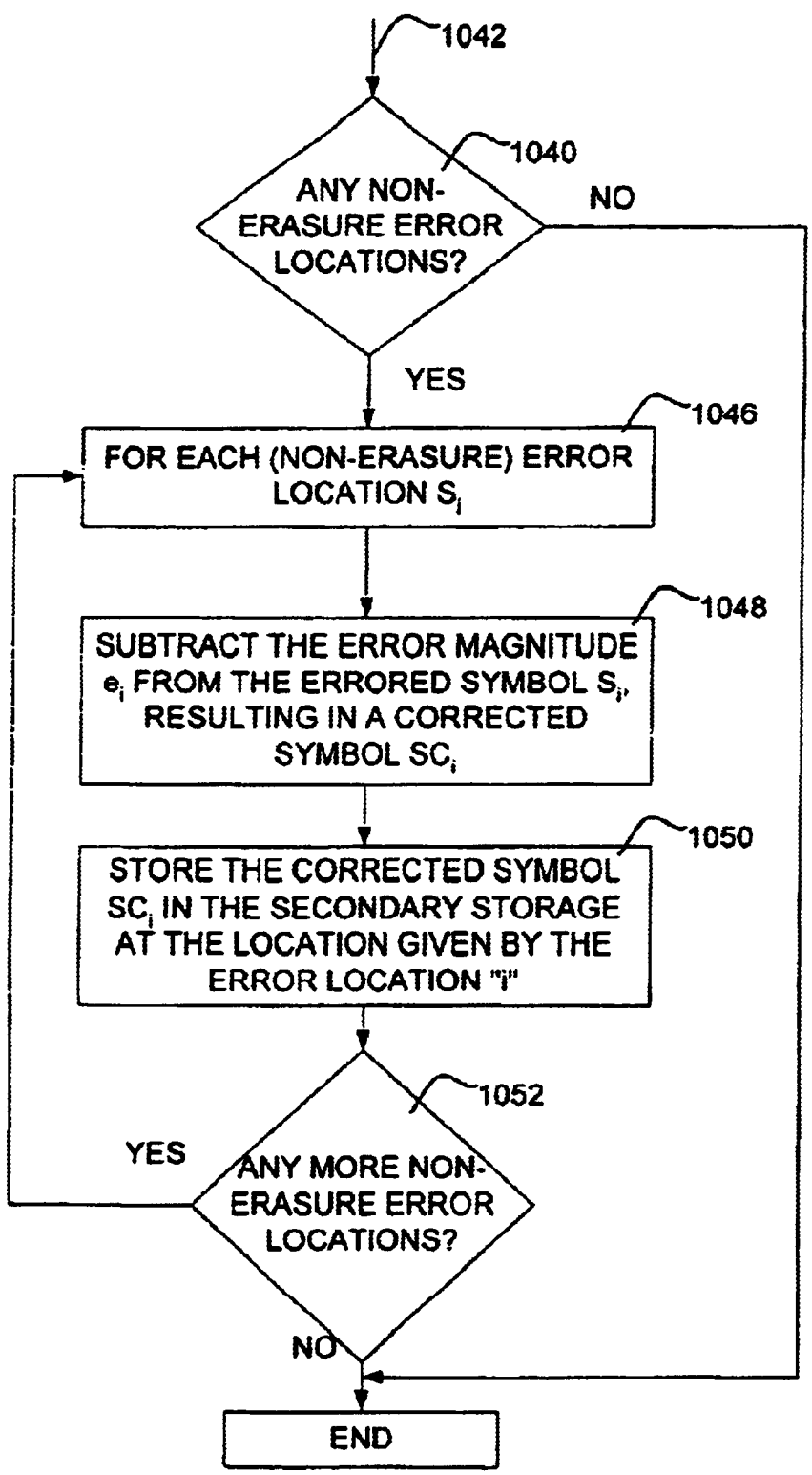

FIG. 9C is a continuation of FIG. 9A showing another illustrative method for determining corrected symbols using the error locations and error magnitudes calculated in FIG. 9A. Step 930 stores the error magnitudes and error locations in secondary storage. Some time later, step 932 fetches the errored symbols, error locations and error magnitudes from. the secondary storage. Preferably, non-errored symbols are not fetched. When a particular error location arrives in working storage, the corresponding errored symbol and error magnitude are fetched. Then, and as shown at step 934, the error magnitude is subtracted from the corresponding errored symbol, resulting in a corrected symbol. Step 936 stores the corrected symbol in the secondary store. This method may save considerable time and resources when, for example, some of the data symbols are never consumed, or when it is convenient for the corrected symbols to be calculated "off line".

FIGS. 10A–10D show a flow diagram of yet another illustrative method for decoding a linear block code using limited working storage. The method is entered at step 1000. Step 1002 provides a syndrome vector having a length of "N–K" entries, where "N" is the length of the protected data block including redundant symbols, and "K" is the length of the original data block. Step 1004 provides an appropriate decoding matrix. The decoding matrix preferably has "N" columns and "N–K" rows. Step 1006 initializes the syndrome vector to zero.

A serial stream of symbols, $r_i$ is then received, where "i" is an integer from 1 to N that identifies a particular symbols position within a block. Step 1008 receives an "ith" symbol, $r_i$. For each received symbol, $r_i$, step 1010 determines if the received symbol, $r_i$ corresponds to an erasure location. If so, step 1014 records index "i" as an erasure location, and sets $r_i$ equal to zero. Rather than setting $r_i$ equal to zero, it is contemplated that the received symbol $r_i$ may be simply skipped when calculating the intermediate syndrome components. That is, control may be passed from step 1014 directly to step 1020, as shown by dotted line 1015.

Thereafter, and as shown at step 1016, the received symbol, $r_i$, is multiplied by the entries in the "ith" column of the decoding matrix, thereby resulting in "N–K" intermediate syndrome components. Step 1018 then adds the "N–K" intermediate syndrome components to the corresponding elements in the syndrome vector. If the received symbol, $r_i$ is one of the original data symbols (e.g., i<K), step 1020 stores the symbol, $r_i$ in the secondary store, particularly for systematic codes. Step 1022 determines if there are received symbols in the block. If so, control is passed back to step 1008 via line 1024.

Once all N of the received symbols $r_i$ are received, step 1026 calculates the error locations using the syndrome vector and the identified erasure locations recorded in step 1014. Using the error locations and the syndrome vector, step 1030 calculates an error vector "E". The error vector "E" stores the error magnitudes for selected symbols in the received stream of symbols.

For each erasure location, j, steps 1032 and 1034 compute the additive inverse of error magnitude $e_j$, resulting in $-e_j$. Step 1036 stores each additive inverse $-e_j$ in the secondary store, overwriting the symbol that corresponds to the erasure location, j. Step 1040 determines if there are any non-erasure error locations. If none are detected, control is passed to step 1054, wherein the algorithm is exited. If one or more non-erasure error locations are detected, control is passed to step 1046.

For each non-erasure error location, Steps 1046 and 1048 subtract the error magnitude $e_j$ from the corresponding errored symbol, resulting in a corrected symbol. Step 1050 stores the corrected symbol in the secondary store, overwriting the errored symbol that corresponds to the non-erasure error location. After all non-erasure error locations have been processed, control is passed to step 1054, wherein the algorithm is exited.

Because the received symbols are often stored to the secondary store as they are received, it is often beneficial for the received symbols to be in the original order of the object, prior to de-interleaving. This may improve the readout performance of the corrected data from the secondary store (e.g., disk) when sequential access is more efficient than random access. This is typically the case for many secondary stores, such as magnetic and optical disk drives.

Figure 11:
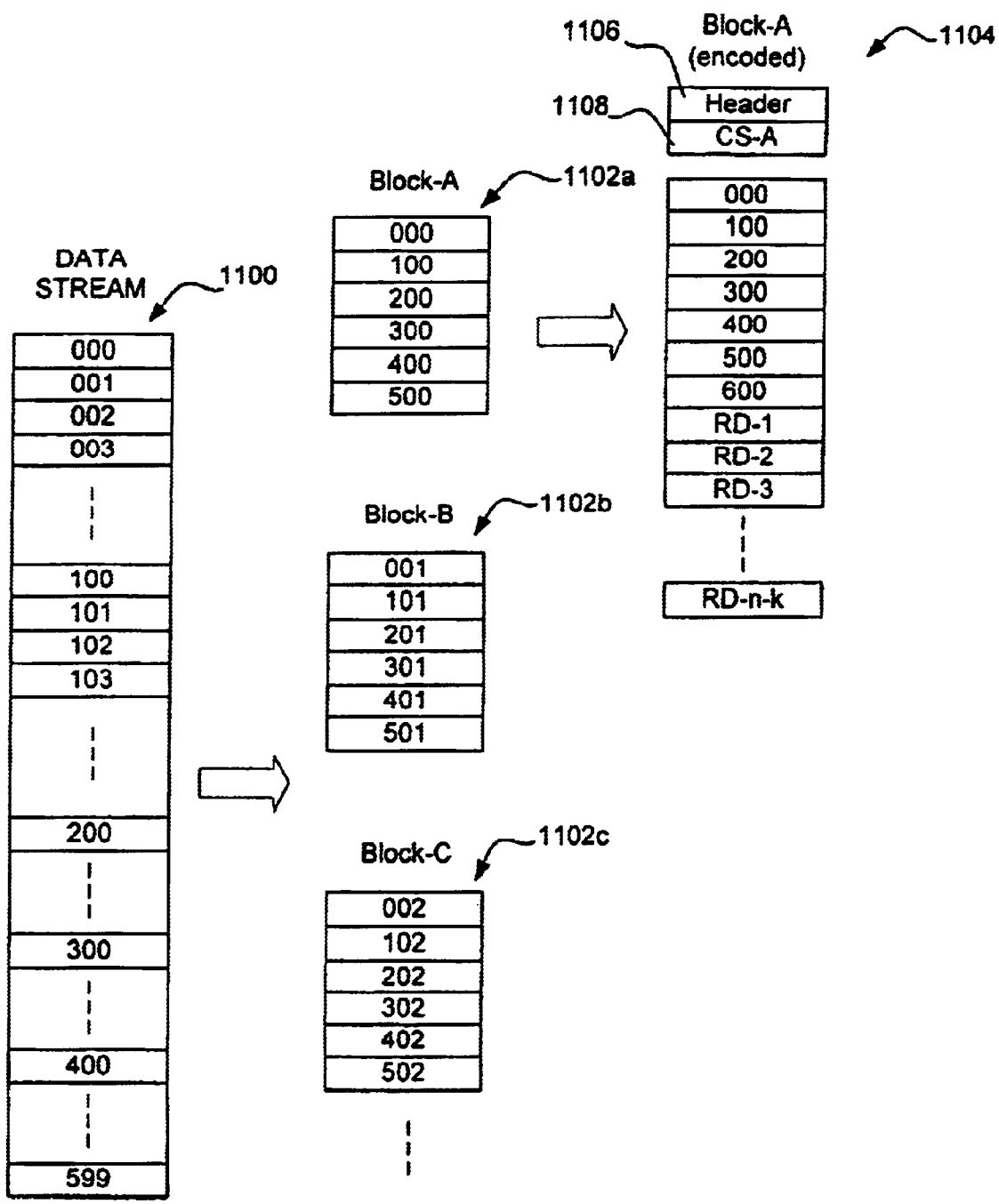
FIG. 11 is a diagram showing an illustrative method for encoding an object using a linear block code.

FIG. 11 is a diagram showing an illustrative method for encoding an object using a linear block code so that the interleaved symbols are in the original order as presented to an encoder. A data stream is generally shown at 1100, having 600 symbols. Each of the symbols is assigned to one of a number of blocks 1102a, 1102b and 1102c. In the illustrative embodiment, each block has six symbols, for a total of 100 blocks. Block 1102a has every one hundredth symbol beginning with symbol "000", block 1102b has every one hundredth symbol beginning with symbol "001", and block 1102c has every one hundredth symbol beginning with symbol "002". To cover all of the symbols of the object 1100, one hundred blocks will be required.

Each of the blocks is then encoded using a conventional block error-correction code. In the illustrative embodiment, block 1102a is encoded using a systematic linear block code, as shown at 1104. The encoded block has the original symbols of un-encoded block 1102a, followed by "N–K" redundant symbols. Blocks 1102b and 1102c may be similarly encoded.

Figure 12:
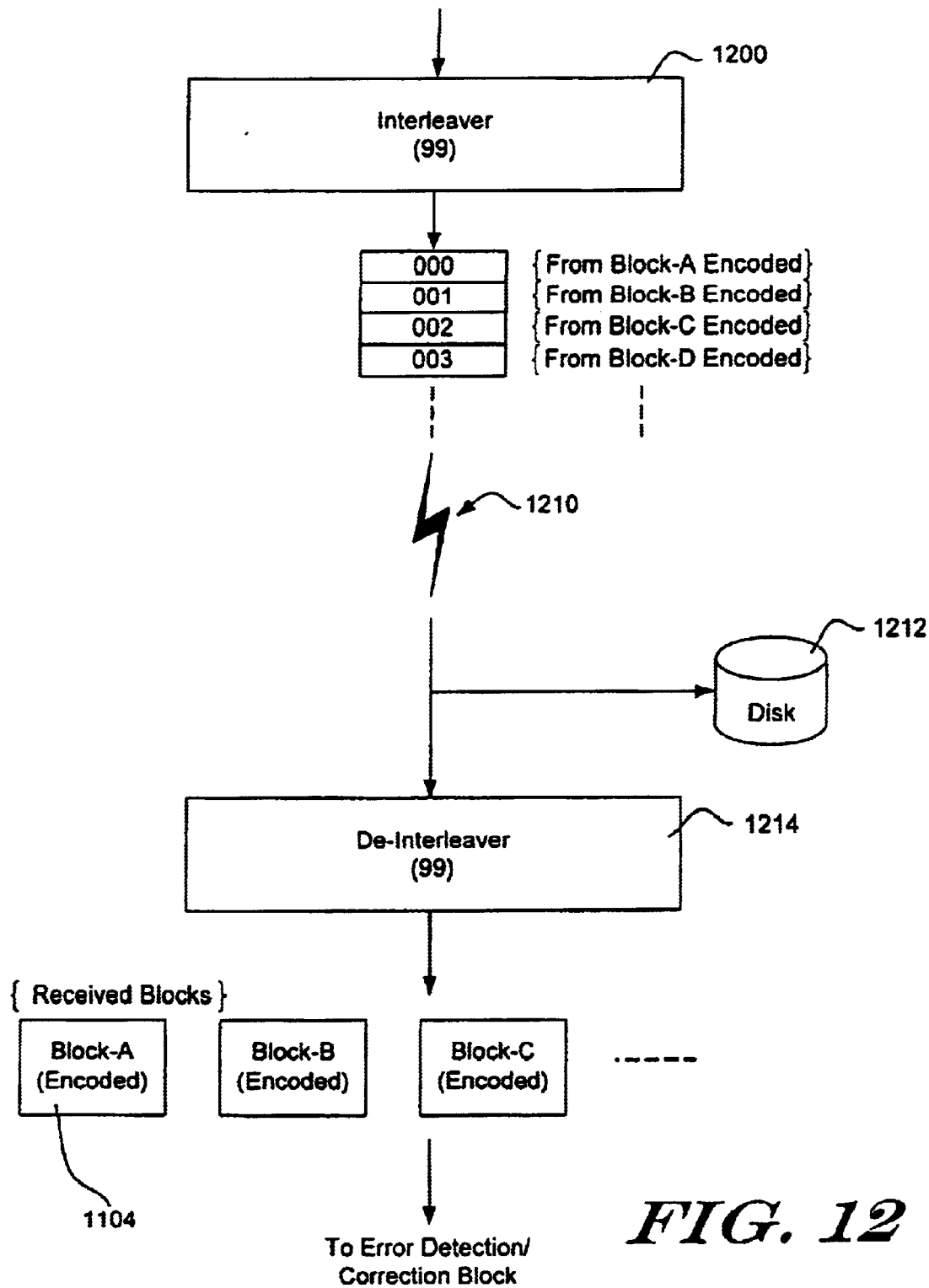
FIG. 12 is a diagram showing an illustrative method for interleaving the encoded symbols of FIG. 11 so that the symbols are transmitted in the original order of the object.

The symbols from each of the blocks 1102a, 1102b and 1102c are then interleaved to provide a stream of output symbols, as shown in FIG. 12. Interleaver 1200 interleaves one hundred symbols, each taken from a different one of the one hundred encoded blocks (see FIG. 11). Thus, the first symbol provided by interleaver 1200 is the first symbol of the encoded block 1104, which is 000. The next symbol provided by interleaver 1200 is the first symbol of the encoded block of block 1102b, which in this case is 001.

This may continue, taking the first symbol from each of the on hundred encoded blocks. As can be seen, the interleaver 1200 provides the symbols in the original order of data stream 1100 of FIG. 11. These symbols are then transmitted over a channel 1210, and the uncorrected symbols are written to secondary store 1212. That is, the uncorrected symbols are written to the secondary store in the original order of object 1100.

The uncorrected symbols are also provided to de-interleaver 1214. De-interleaver de-interleaves the uncorrected symbols into one hundred blocks, thereby re-creating the encoded blocks of FIG. 11. The encoded blocks may then be provided to an error-detection and correction block, as described above, to provide corrected symbols for each of the blocks. Finally, the blocks can be reassembled into the original object 1100.

As can be seen, the assigning, encoding and interleaving steps may be configured so that the stream of output symbols from the interleaver 1200 is delivered in the original order of the object 1100. This is accomplished by assigning the symbols to the blocks 1102a, 1102b, and 1102c in the same order as the interleaver 1200 interleaves the symbols from the encoded blocks.

FIG. 13 is a diagram showing that each block may have a programmable (e.g., tunable) ECC level. In some cases, it is desirable for each block (or object) to have an assigned ECC level. The assigned ECC level may effect the block size, the number of redundant symbols generated, the degree of interleave, etc. This allows some of the blocks (or objects) to have a higher level of protection than other blocks (or objects). This may be desirable when, for example, some blocks or objects must be transmitted with few errors, such as blocks of data that control the system. Other blocks or objects, such as certain content, may be transmitted with more errors without significantly effecting the quality of the system. By tuning the ECC level, the resources of the system may be more efficiently used.

Referring to FIG. 13, each block can be assigned an ECC quality factor, such as from zero to ten. Depending on the quality factor, a number of ECC parameters can be set to control the ECC level of the block. For example, if the ECC quality factor is set in the lower half of the zero-to-ten scale, then only one level of ECC may be required. If the ECC quality factor is in the upper half of the scale, then two levels of ECC may be required. This is, of course, only illustrative.

The first ECC level may provide an error-correction code to the block of data, as described above. A block of data encoded with a first ECC level is shown at 1300, and includes "K" original symbols followed by "N–K" redundant symbols. The ECC1 parameters 1302 may control the block size, the number of redundant symbols generated, the degree of interleave, etc. The second ECC level may provide an error-correction code around the "N" symbols shown at 1300. That is, the "N" symbols of the first ECC level may be treated as the original symbols for the second ECC level. Additional (N'–K') redundant symbols may then be added, as shown at 1304. The ECC2 parameters 1306 may control the block size, the number of redundant symbols generated, the degree of interleave, etc. for the second ECC level.

It is contemplated that the second ECC level may be encoded after the first ECC encoded blocks are interleaved with other encoded blocks. This may help reduce the memory and I/O requirements of the system. That is, since interleaving tends to increase memory and I/O usage, the second non-interleaved layer may first be decoded and checked for errors, followed by the first interleaved layer. If no errors are found in the second non-interleaved layer, the first interleaved error need not be decoded. This may reduce the frequency that the first interleaved layer is decoded, which may reduce the memory and I/O requirements of the system. Other encoding and decoding techniques are also contemplated.

In some applications, a working store may also be used to encode a block of data. FIG. 14 is a diagram showing an illustrative encoding algorithm that uses limited working storage in accordance with the present invention. As indicated above, in an (N,K) error-correcting block code, the incoming data stream is split into groups of K information symbols. (If less than K symbols are available at the encoder input, zeroes are substituted for the missing symbols). From this group of K symbols, the encoder generates a single code word "c" which contains N symbols.

Let "a" be the input vector of K information symbols. Let "c" be the code word vector of N symbols. The N symbols are calculated by multiplying a generator matrix "G" over a finite field, where G is a matrix with "N" rows and "K" columns. For "linear" block codes, any K rows of G are linearly independent. Thus, the code word symbols $c_i$ are calculated using the relation c=Ga. This relation is shown at 1400, and is expressed in more detail at 1402.

As with the decoding algorithm discussed above, the value of the code word vector "c" is a linear combination of the columns of G. Accordingly, the code word calculation can be rewritten as the sum of "K" intermediate code word components, as shown at 1404. Accordingly, and to minimize working storage, the code word symbols may be calculated incrementally as each of the "K" input symbols is received. For example, as each input symbol $a_i$ of the input vector is received, the received symbol $a_i$ is multiplied by the entries in the "ith" column of the encoding matrix G, resulting in intermediate code word components. The intermediate code word components are then added to the appropriate entry in the code word vector "c". Once all input symbols a, are received, the code word vector "c" will contain the encoded code word for the input vector "a".

A benefit of using this approach is that all of the symbols of the input vector "a" need not be stored in the working store at the same time. Rather, each symbol a, may be sequentially stored in a working store and then removed from the working store after the corresponding intermediate code word components are calculated.

While the many of the preferred embodiments of the present invention are described with respect to an unreliable communication channel, such as a digital wireless transmission system, it is contemplated that the present invention may be applied to any application where error correction coding (ECC) is desirable. For example, ECC coding is often desirable when reading or writing to magnetic and/or optical storage devices, such as magnetic or CD-ROM drives. The present invention may be used in conjunction with these devices to reduce the working storage requirements thereof. Those of skill in the art will readily appreciate that the teachings found herein may be applied to many other embodiments, all within the scope of the claims hereto attached.

What is claimed is:

1. A method for calculating a syndrome vector for an incoming stream of symbols that is protected by a block error-correction code, the stream of symbols having N symbols, with K symbols being original data symbols (K<N), and N-K symbols being redundant symbols, the method comprising:

making a decoding matrix available, the decoding matrix having N columns and "N-K" rows;

receiving the stream of symbols, $r_i$, where "i" is an integer from 1 to N that identifies a particular position of the symbols within the stream of symbols; and as each symbol, $r_i$, is received, multiplying the received symbol, $r_i$, by the entries in the "ith" column of the decoding matrix, thereby resulting in "N-K" intermediate syndrome components, and adding each of the intermediate syndrome components for the received symbol, $r_i$, to a corresponding position of a syndrome vector.

2. A method according to claim 1, further comprising storing each of the received symbols, $r_i$, in a secondary store.

3. A method according to claim 2, further comprising removing the received symbol, $r_i$, from a working memory after each of the intermediate syndrome components for the received symbol, $r_i$ are added to the syndrome vector.

4. A method according to claim 1, further comprising initializing the syndrome vector to zero before any of the intermediate syndrome components are added to the syndrome vector.

5. A method for decoding a stream of symbols that is protected by a block error-correction code, the method comprising:

receiving the stream of symbols;

as each symbol is received, calculating one or more intermediate syndrome components, and adding the intermediate syndrome components to a corresponding entry of a syndrome vector;

using the syndrome vector to identify error locations of those symbols that have an error, and calculating an error magnitude for each errored symbol; and applying the error magnitudes to the corresponding errored symbols to produce corrected symbols.

6. A method according to claim 5, wherein the syndrome vector is initialized to zero before any of the intermediate syndrome components are added to the syndrome vector.

7. A method according to claim 5, further comprising identifying erasure locations for those symbols in the stream of symbols.

8. A method according to claim 7, wherein those symbols that have an error are identified using both the syndrome vector and the erasure locations.

9. A method according to claim 5, further comprising storing the received stream of symbols in a secondary store.

10. A method according to claim 9, further comprising removing the received symbol from a working memory after each of the intermediate syndrome components for the received symbol are added to the syndrome vector.

11. A method according to claim 10, further comprising storing the syndrome vector in a working store.

12. A method according to claim 11, further comprising storing the error locations in the working store.

13. A method according to claim 12, further comprising storing the error magnitudes in the working store.

14. A method according to claim 13, further comprising:

fetching the errored symbols from the secondary store; and fetching the error magnitudes from the working store before the error magnitudes are applied to the corresponding errored symbols to produce the corrected symbols.

15. A method according to claim 5, wherein the error magnitudes are subtracted from the corresponding errored symbols to produce the corrected symbols.

16. A method according to claim 5, further comprising storing the corrected symbols in the secondary store.

17. A method according to claim 5, further comprising storing the error magnitudes and the error locations in the secondary store.

18. A method according to claim 17, further comprising fetching the error locations, errored symbols and error magnitudes from the secondary store at some later time, and then applying the error magnitudes to the corresponding errored symbols to produce the corrected symbols.

19. A method for decoding an incoming stream of symbols that is protected by a block error-correction code, the stream of symbols having N symbols, with K symbols being original data symbols (K<N), and N-K symbols being redundant symbols, the method comprising:
- initializing a syndrome vector to zero, the syndrome vector having N-K entries;
- making a decoding matrix available, the decoding matrix having N columns and "N-K" rows;
- receiving the stream of symbols, $r_i$, where "i" is an integer from 1 to N that identifies a particular one of the symbols within the stream of symbols;
- determining if the received symbol, $r_i$ is identified as an erasure location, and if so, recording index "i" as an erasure location and setting $r_i$ to zero;
- multiplying the received symbol, $r_i$, by the entries in the "ith" column of the decoding matrix, thereby resulting in "N-K" intermediate syndrome components, and adding the intermediate syndrome components for the received symbol, $r_i$ to the corresponding entry in the syndrome vector;
- if i<K, store $r_i$ in the secondary store;
- once all N of the symbol positions have been processed, calculating error locations in the stream of symbols using the syndrome vector and the identified erasure locations;
- calculating an error vector, e, using the error locations and the syndrome, the error vector, e, storing error magnitudes for selected symbols in the received stream of symbols;
- for each erasure location, j, calculating the additive inverse of error magnitude $e_j$ to $-e_j$, and store the additive inverse $-e_j$ in the secondary store, overwriting the symbol that corresponds to the erasure location, j; and
- for each non-erasure error location, subtracting the error magnitude $e_j$ from the corresponding errored symbol, resulting in a corrected symbol, and storing the corrected symbol in the secondary store, overwriting the errored symbol that corresponds to the non-erasure error location.

20. A syndrome processor for calculating a syndrome vector of an incoming stream of symbols that is protected by a block error-correction code, the stream of symbols having N symbols, with K symbols being original data symbols (K<N), and N-K symbols being redundant symbols, the syndrome processor comprising:
- an input for receiving the stream of symbols, $r_i$, where "i" is an integer from 1 to N identifying a particular position of the symbols within the stream of symbols;
- a storage element for storing a decoding matrix, the decoding matrix having N columns and "N-K" rows;
- a multiplier for multiplying each received symbol, $r_i$, by the entries in the "ith" column of the decoding matrix, thereby resulting in "N-K" intermediate syndrome components for each received symbol, $r_i$; and
- an adder for adding the intermediate syndrome components for each received symbol, $r_i$ to the corresponding entry in the syndrome vector.

21. A syndrome processor according to claim 20, wherein the incoming stream of symbols is interleaved with other incoming streams of symbols.

22. A decoder for decoding a stream of symbols that is protected by a block error-correction code, the decoder comprising:
- an input for receiving the stream of symbols;
- syndrome calculating block for calculating one or more intermediate syndrome components as each symbol is received, and adding the intermediate syndrome components to a corresponding entry of a syndrome vector;
- an error locator for identifying the location of the errored symbols using the syndrome vector;
- an error magnitude calculator for calculating the error magnitude for each errored symbol using the locations of the errored symbols provided by the error locator and the syndrome vector; and
- an error corrector for applying the error magnitudes to the corresponding errored symbols, thereby resulting in corrected symbols.

23. A decoder according to claim 22, further comprising a working store and a secondary store.

24. A decoder according to claim 23, wherein the working store comprises random access memory.

25. A decoder according to claim 23, wherein the secondary store comprises a magnetic or optical disk.

26. A decoder according to claim 23, wherein the stream of symbols are stored in the secondary store.

27. A decoder according to claim 23, wherein the syndrome vector is stored in the working store.

28. A decoder according to claim 27, wherein the error locator reads the syndrome vector from the working store.

29. A decoder according to claim 23, wherein the error locator stores the locations of the errored symbols in the working store.

30. A decoder according to claim 23, wherein the error locator stores the locations of the errored symbols in the secondary store.

31. A decoder according to claim 23, wherein the error magnitude calculator stores the error magnitude for each errored symbol in the working store.

32. A decoder according to claim 23, wherein the error magnitude calculator stores the error magnitude for each errored symbol in the secondary store.

33. A decoder according to claim 23, wherein the error corrector stores the corrected symbols in the working store.

34. A decoder according to claim 23, wherein the error corrector stores the corrected symbols in the secondary store.

35. A method for encoding and delivering a stream of data having a number of symbols in an original order, the method comprising:
- assigning each of the symbols of the stream to one of a number of blocks;
- encoding each of the blocks using a block error-correction code;
- interleaving the symbols from two or more of the blocks to provide a stream of output symbols; and
- the assigning, encoding and interleaving steps operatively configured so that the stream of output symbols are delivered in the original order of the stream.

36. A system for encoding and delivering a stream of data having a number of symbols in an original order, the encoder comprising:

a block assignor for assigning each of the symbols of the stream to one of a number of blocks;

an encoder for encoding each of the blocks using a block error-correction code; and an interleaver coupled to the encoder for interleaving the symbols from two or more of the blocks, the block assignor, encoder and interleaver operatively configured such that the interleaver outputs the symbols of the stream of data in the original order of the stream of data.

37. A system according to claim 36, further comprising a receiver for receiving the symbols from the interleaver and storing the output symbols to a secondary store without de-interleaving.

38. A system according to claim 37, wherein the receiver further comprises a de-interleaver for de-interleaving the output symbols.

39. A system according to claim 36, wherein the order of the block error-correction code of the encoder is different for selected objects.

40. A system according to claim 36, wherein the order of the block error-correction code of the encoder is different for selected blocks.

41. A system according to claim 40, wherein the order of the block error-correction code is specified in a predetermined data field that is read by the encoder.

42. A system according to claim 36, wherein the block size is different for selected streams.

43. A system according to claim 1, wherein the degree of interleave is different for selected streams.

44. A method for encoding and delivering a stream of data having a number of symbols, the method comprising:

assigning each of the symbols of the stream of data to one of a number of first ECC blocks;

encoding each of the first ECC blocks using a block error-correction code (ECC) to provide a first ECC layer;

interleaving the symbols from two or more of the encoded first ECC blocks to provide a stream of first ECC output symbols;

assigning each of the first ECC output symbols to one of a number of second ECC blocks;

encoding each of the second ECC blocks using a block error-correction code (ECC), to provide a second ECC layer; and delivering a stream of second ECC output symbols.

45. A method for receiving and decoding the stream of second ECC output symbols of claim 44, comprising:

receiving the stream of second ECC output symbols;

decoding the stream of second ECC output symbols resulting in a stream of first ECC output symbols arranged into a number of second ECC blocks;

determining if there is an error in one of the second ECC blocks;

de-interleaving the stream of first ECC output symbols if an error is detected in one of the second ECC blocks;

decoding the de-interleaved stream of symbols if an error is detected in one of the second ECC blocks; and skipping the de-interleave and second decoding step if an error is not detected during the determining step.

* * * * *